(12) United States Patent
Khlat

(10) Patent No.: US 12,068,720 B2
(45) Date of Patent: Aug. 20, 2024

(54) BARELY DOHERTY DUAL ENVELOPE TRACKING (BD2E) CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 344 days.

(21) Appl. No.: 17/351,560

(22) Filed: Jun. 18, 2021

(65) Prior Publication Data

US 2022/0278651 A1    Sep. 1, 2022

Related U.S. Application Data

(60) Provisional application No. 63/154,030, filed on Feb. 26, 2021.

(51) Int. Cl.
| | | |
|---|---|---|
| *H03F 1/02* | (2006.01) | |
| *H03F 3/24* | (2006.01) | |
| *H04B 1/04* | (2006.01) | |

(52) U.S. Cl.
CPC .......... *H03F 1/0288* (2013.01); *H03F 3/245* (2013.01); *H04B 1/04* (2013.01); *H03F 2200/105* (2013.01); *H03F 2200/451* (2013.01); *H04B 2001/045* (2013.01)

(58) Field of Classification Search
CPC .. H03F 1/0288; H03F 3/245; H03F 2200/105; H03F 2200/451; H03F 1/56; H03F 3/19; H03F 1/0222; H04B 1/04; H04B 2001/045
USPC ....................................................... 330/295
See application file for complete search history.

(56) References Cited

U.S. PATENT DOCUMENTS

| | | |
|---|---|---|
| 5,510,753 A | 4/1996 | French |
| 5,838,732 A | 11/1998 | Carney |
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 | 6/2002 | Nork et al. |
| 6,985,033 B1 | 1/2006 | Shirali et al. |

(Continued)

FOREIGN PATENT DOCUMENTS

| | | |
|---|---|---|
| CN | 103916093 A | 7/2014 |
| CN | 105322894 A | 2/2016 |

(Continued)

OTHER PUBLICATIONS

Written Opinion for International Patent Application No. PCT/US2021/052830, dated Nov. 3, 2022, 7 pages.

(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

A barely Doherty dual envelope tracking (BD$^2$E) circuit has a transmitter chain that includes an envelope tracking (ET) circuit that controls a Doherty dual power amplifier array. The ET circuit provides two control signals (supply voltage signals) that are used to control or modulate a carrier amplifier and a peaking amplifier independently of one another. The BD$^2$E circuit includes an improved impedance inverter that isolates the peaking amplifier from the carrier amplifier to allow this independent control. By providing independent control, greater linearity may be provided while preserving the efficiency of the circuit.

21 Claims, 20 Drawing Sheets

(56) References Cited

U.S. PATENT DOCUMENTS

| | | |
|---|---|---|
| 7,043,213 B2 | 5/2006 | Robinson et al. |
| 7,193,467 B2 | 3/2007 | Garlepp et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,705,451 B2 | 7/2017 | Takenaka et al. |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,090,809 B1 | 10/2018 | Khlat |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,116,470 B2 | 10/2018 | Gu et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,361,744 B1 | 7/2019 | Khlat |
| 10,382,071 B2 | 8/2019 | Rozek et al. |
| 10,476,437 B2 | 11/2019 | Nag et al. |
| 10,756,675 B2 | 8/2020 | Leipold et al. |
| 10,862,431 B1 | 12/2020 | Khlat |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1 | 6/2003 | Khouri et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0036212 A1 | 2/2007 | Leung et al. |
| 2007/0052474 A1 | 3/2007 | Saito |
| 2007/0258602 A1 | 11/2007 | Vepsalainen et al. |
| 2007/0290748 A1 | 12/2007 | Woo et al. |
| 2008/0116960 A1 | 5/2008 | Nakamura |
| 2008/0231358 A1 | 9/2008 | Maemura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 | 11/2010 | Pierdomenico |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0148705 A1 | 6/2011 | Kenington |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0281597 A1 | 11/2012 | Khlat et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0072139 A1 | 3/2013 | Kang et al. |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0169427 A1 | 6/2014 | Asenio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |

(56) References Cited

U.S. PATENT DOCUMENTS

| | | |
|---|---|---|
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0288645 A1 | 9/2019 | Nag et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0350878 A1 | 11/2020 | Drogi et al. |
| 2020/0382061 A1 | 12/2020 | Khlat |
| 2020/0382066 A1 | 12/2020 | Khlat |
| 2021/0036604 A1 | 2/2021 | Khlat et al. |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2022/0021348 A1 | 1/2022 | Philpott et al. |
| 2022/0103137 A1 | 3/2022 | Khlat et al. |
| 2022/0123698 A1 | 4/2022 | Goto et al. |

FOREIGN PATENT DOCUMENTS

| | | |
|---|---|---|
| CN | 105680807 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 108141184 A | 6/2018 |
| CN | 109150212 A | 1/2019 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Non-Final Office Action for U.S. Appl. No. 14/836,634, dated May 16, 2016, 9 pages.

Non-Final Office Action for U.S. Appl. No. 14/868,890, dated Jul. 14, 2016, 13 pages.

Non-Final Office Action for U.S. Appl. No. 15/792,909, dated May 18, 2018, 13 pages.

Notice of Allowance for U.S. Appl. No. 15/459,449, dated Mar. 28, 2018, 7 pages.

Notice of Allowance for U.S. Appl. No. 15/723,460, dated Jul. 24, 2018, 8 pages.

Notice of Allowance for U.S. Appl. No. 15/704,131, dated Jul. 17, 2018, 7 pages.

Notice of Allowance for U.S. Appl. No. 15/728,202, dated Aug. 2, 2018, 7 pages.

Non-Final Office Action for U.S. Appl. No. 15/888,300, dated Aug. 28, 2018, 11 pages.

Notice of Allowance for U.S. Appl. No. 15/792,909, dated Dec. 19, 2018, 11 pages.

Notice of Allowance for U.S. Appl. No. 15/993,705, dated Oct. 31, 2018, 7 pages.

Pfister, Henry, "Discrete-Time Signal Processing," Lecture Note, pfister.ee.duke.edu/courses/ece485/dtsp.pdf, Mar. 3, 2017, 22 pages.

Non-Final Office Action for U.S. Appl. No. 15/888,260, dated May 2, 2019, 14 pages.

Non-Final Office Action for U.S. Appl. No. 15/986,948, dated Mar. 28, 2019, 8 pages.

Non-Final Office Action for U.S. Appl. No. 16/018,426, dated Apr. 11, 2019, 11 pages.

(56) References Cited

OTHER PUBLICATIONS

Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Notice of Allowance for U.S. Appl. No. 15/964,762, dated Mar. 18, 2019, 7 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Notice of Allowance for U.S. Appl. No. 16/582,471, dated Jun. 22, 2021, 9 pages.
Non-Final Office Action for U.S. Appl. No. 16/597,952, dated May 26, 2021, 7 pages.
Notice of Allowance for U.S. Appl. No. 16/834,049, dated Jun. 24, 2021, 8 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Final Office Action for U.S. Appl. No. 17/163,642, dated Nov. 25, 2022, 13 pages.
Notice of Allowance for U.S. Appl. No. 17/032,553, dated Oct. 11, 2022, 7 pages.
Non-Final Office Action for U.S. Appl. No. 17/073,764, dated Sep. 30, 2022, 13 pages.
Notice of Allowance for U.S. Appl. No. 17/073,764, dated Aug. 23, 2023, 12 pages.
Notice of Allowance for U.S. Appl. No. 17/163,642, dated Mar. 1, 2023, 10 pages.
Final Office Action for U.S. Appl. No. 17/073,764, dated Mar. 3, 2023, 14 pages.
International Preliminary Report on Patentability for International Patent Application No. PCT/US2021/052830, dated Feb. 20, 2023, 21 pages.
First Office Action for Chinese Patent Application No. 202010083654.0, dated May 12, 2023, 17 pages.
Notification to Grant for Chinese Patent Application No. 202010097807.7, dated Jul. 11, 2023, 14 pages.
International Preliminary Report on Patentability for International Patent Application No. PCT/US2021/050892, dated Oct. 24, 2022, 20 pages.
Advisory Action for U.S. Appl. No. 17/073,764, dated May 26, 2023, 3 pages.

(56) References Cited

OTHER PUBLICATIONS

Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/032,553, dated Jul. 29, 2022, 6 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
Notice of Allowance for U.S. Appl. No. 15/984,566, dated Mar. 18, 2019, 7 pages.
Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/052151, dated Jan. 4, 2022, 16 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
U.S. Appl. No. 16/834,049, filed Mar. 30, 2020.
U.S. Appl. No. 17/032,553, filed Sep. 25, 2020.
U.S. Appl. No. 17/073,764, filed Oct. 19, 2020.
U.S. Appl. No. 17/363,522, filed Jun. 30, 2021.
Chen, S. et al., "A 4.5 µW 2.4 GHZ Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
Non-Final Office Action for U.S. Appl. No. 17/363,568, dated Nov. 9, 2023, 8 pages.
Decision to Grant for Chinese Patent Application No. 202010083654.0, dated Sep. 11, 2023, 8 pages.
Notification to Grant for Chinese Patent Application No. 202010083654.0, mailed Nov. 9, 2023, 8 pages.
Notice of Allowance for U.S. Appl. No. 17/363,568, mailed Jan. 3, 2024, 7 pages.
Non-Final Office Action for U.S. Appl. No. 17/343,912, mailed Dec. 14, 2023, 6 pages.
Examination Report for European Patent Application No. 21790723.7, mailed Mar. 7, 2024, 5 pages.
Notice of Allowance for U.S. Appl. No. 17/343,912, mailed Mar. 4, 2024, 7 pages.
Non-Final Office Action for U.S. Appl. No. 17/331,996, mailed Feb. 1, 2024, 9 pages.
Notice of Allowance for U.S. Appl. No. 17/331,996, mailed Mar. 1, 2024, 8 pages.
Intention to Grant for European Patent Application No. 21806074.7, mailed May 10, 2024, 27 pages.
Notice of Allowance for U.S. Appl. No. 17/331,996, mailed Jun. 14, 2024, 9 pages.
Notice of Allowance for U.S. Appl. No. 17/351,560, mailed Apr. 19, 2024, 8 pages.
International Search Report and Written Opinion for International Patent Application No. PCT/US2023/085103, mailed Apr. 26, 2024, 17 pages.

BARELY DOHERTY DUAL ENVELOPE TRACKING (BD2E) CIRCUIT

RELATED APPLICATION

This application claims the benefit of U.S. provisional patent application Ser. No. 63/154,030, filed Feb. 26, 2021, the disclosure of which is hereby incorporated herein by reference in its entirety.

FIELD OF THE DISCLOSURE

The technology of the disclosure relates generally to a radio frequency (RF) transmitter and, more particularly, to an envelope tracking (ET) circuit that controls power amplifiers within an RF transmitter.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices.

Various power amplifier arrangements have been proposed and implemented in transmitter chains within the mobile communication devices to provide the desired output power while also meeting the power level control requirements of 5G-NR. One such power amplifier arrangement is the Doherty dual amplifier, which uses a carrier amplifier to operate at voltages up to the average power and uses the carrier amplifier and a peaking amplifier to operate at voltages between the average power and a peak power. While the Doherty dual amplifier provides options for providing power amplification, there remains room for improved power amplification.

SUMMARY

Embodiments of the disclosure relate to a barely Doherty dual envelope tracking ($BD^2E$) circuit. In a non-limiting example, a transmitter chain includes an envelope tracking (ET) circuit that controls a Doherty dual power amplifier array. The ET circuit provides two control signals (supply voltage signals) that are used to control or modulate a carrier amplifier and a peaking amplifier independently of one another. The $BD^2E$ circuit includes an improved impedance inverter that isolates the peaking amplifier from the carrier amplifier to allow this independent control. By providing independent control, greater linearity may be provided while preserving the efficiency of the circuit.

In one aspect, a power amplifier circuit is disclosed. The power amplifier circuit comprises a carrier amplifier. The power amplifier circuit also comprises a peaking amplifier. The power amplifier circuit also comprises an impedance inverter coupling the carrier amplifier to the peaking amplifier. The impedance inverter comprises a supply voltage input node, wherein a supply voltage received at the supply voltage input node modulates the carrier amplifier. The power amplifier circuit also comprises a transformer circuit coupled to the peaking amplifier. The transformer circuit comprises a second supply voltage input node, wherein a second supply voltage received at the second supply voltage input node modulates the peaking amplifier separately from modulation of the carrier amplifier. The power amplifier circuit also comprises an output node coupled to the transformer circuit, wherein an amplified signal from the transformer circuit may be output at the output node.

In another aspect, a transmitter circuit is disclosed. The transmitter circuit comprises a transceiver. The transmitter circuit also comprises an ET circuit coupled to the transceiver, wherein the ET circuit is configured to provide a first voltage supply signal and a second voltage supply signal. The transmitter circuit also comprises a power amplifier circuit. The power amplifier circuit comprises a carrier amplifier. The power amplifier circuit also comprises a peaking amplifier. The power amplifier circuit also comprises an impedance inverter coupling the carrier amplifier to the peaking amplifier. The impedance inverter comprises a supply voltage input node coupled to the ET circuit to receive the first voltage supply signal. The power amplifier circuit also comprises a transformer circuit coupled to the peaking amplifier. The transformer circuit comprises a second supply voltage input node coupled to the ET circuit to receive the second voltage supply signal. The peaking amplifier is modulated separately from the carrier amplifier. The power amplifier circuit also comprises an output node coupled to the transformer circuit, wherein an amplified signal from the transformer circuit may be output at the output node.

In another aspect, a power amplifier circuit is disclosed. The power amplifier circuit comprises a carrier amplifier. The power amplifier circuit also comprises a peaking amplifier. The power amplifier circuit also comprises an impedance inverter coupling the carrier amplifier to the peaking amplifier. The impedance inverter comprises a first supply voltage input node, wherein a first supply voltage received at the first supply voltage input node modulates the carrier amplifier. The impedance inverter also comprises a second supply voltage input node, wherein a second supply voltage received at the second supply voltage input node modulates the peaking amplifier. The power amplifier circuit also comprises a transformer circuit coupled to the peaking amplifier. The power amplifier circuit also comprises an output node coupled to the transformer circuit, wherein an amplified signal from the transformer circuit may be output at the output node.

In another aspect, a power amplifier circuit is disclosed. The power amplifier circuit comprises a carrier amplifier. The power amplifier circuit also comprises a peaking amplifier. The power amplifier circuit also comprises an impedance inverter coupling the carrier amplifier to the peaking amplifier. The impedance inverter comprises an inductor pair comprising a first inductor positively coupled to a second inductor, the second inductor in series with the first inductor. The power amplifier circuit also comprises a transformer circuit coupled to the peaking amplifier. The transformer circuit comprises a supply voltage input node, wherein a supply voltage received at the supply voltage input node modulates the peaking amplifier and the carrier amplifier. The power amplifier circuit also comprises an output node coupled to the transformer circuit, wherein an amplified signal from the transformer circuit may be output at the output node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
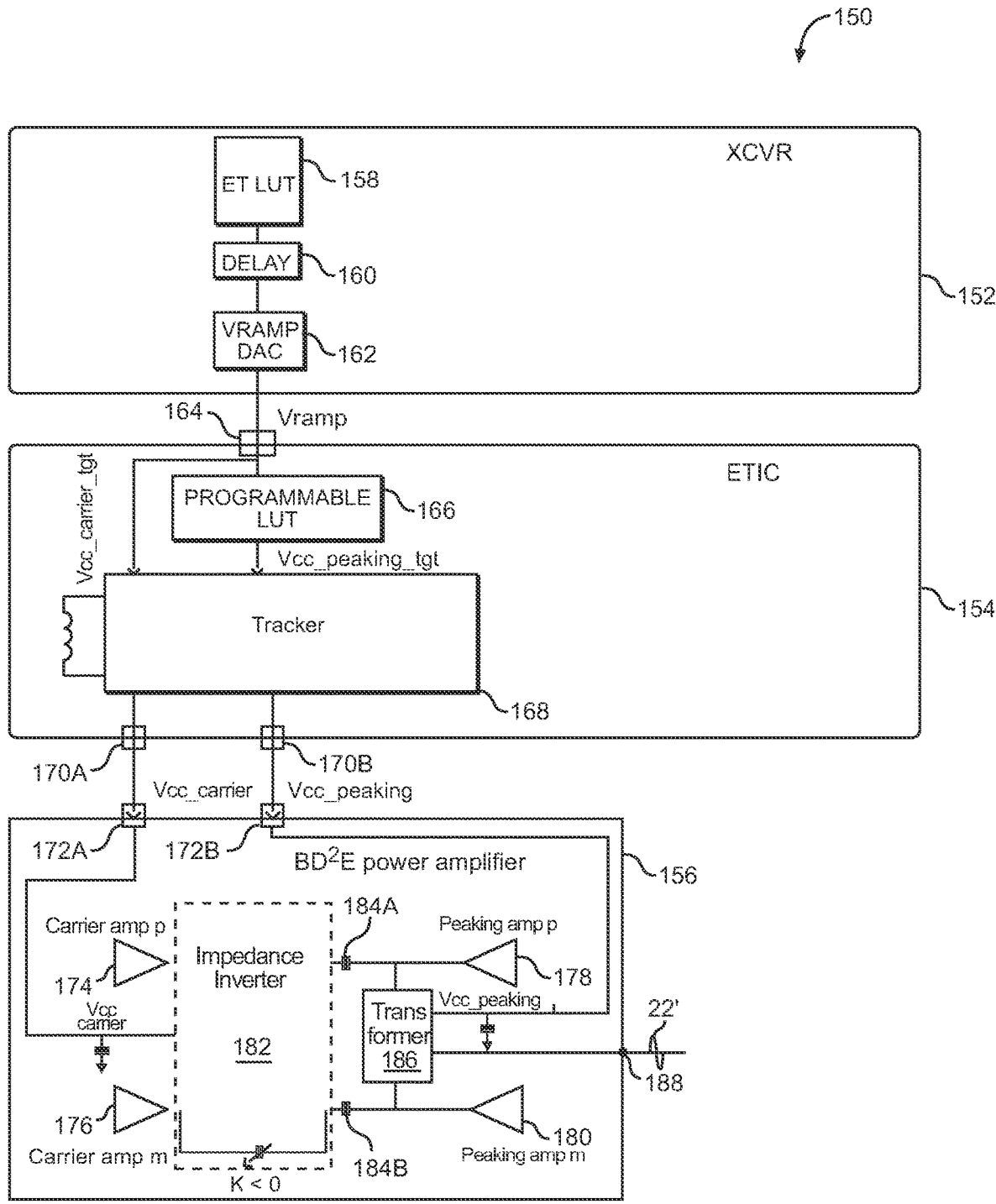
FIG. 4 is a block diagram of a barely Doherty dual amplifier circuit operating with an ET circuit that uses information from a transceiver according to an exemplary aspect of the present disclosure.
Figure 5:
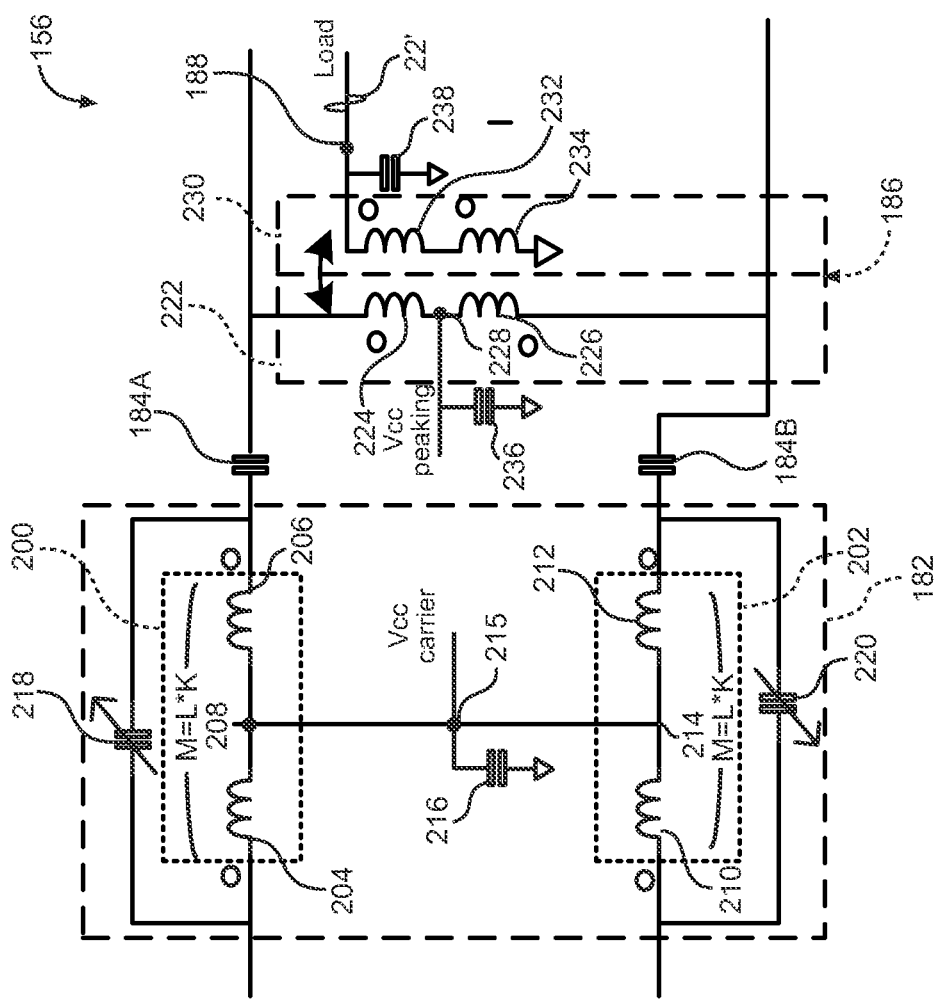

FIG. 5 provides a circuit-level diagram of the impedance inverter and transformer circuit of the barely Doherty dual amplifier circuit of FIG. 4, FIGS. 6A-6D provide an illustration of the progression from an ideal impedance inverter to a practical impedance inverter using negatively-coupled inductors.

FIGS. 7A-7D provide an illustration of the progression from an ideal impedance inverter to a practical impedance inverter using positively-coupled inductors.

Figure 8:
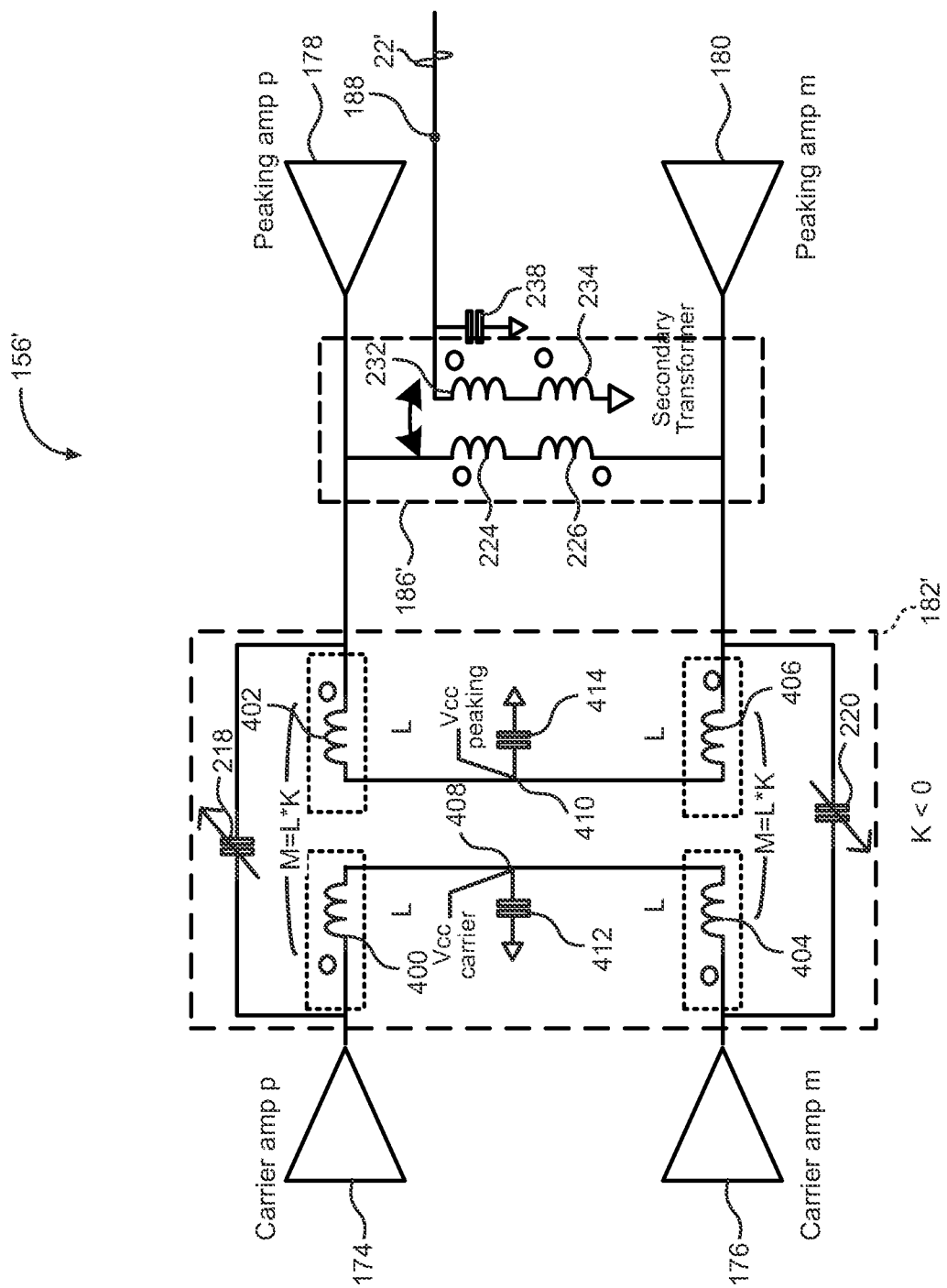

FIG. 8 provides an alternate power amplifier circuit where both Vcc_carrier and Vcc_peaking are provided in the impedance inverter.

Figure 9:
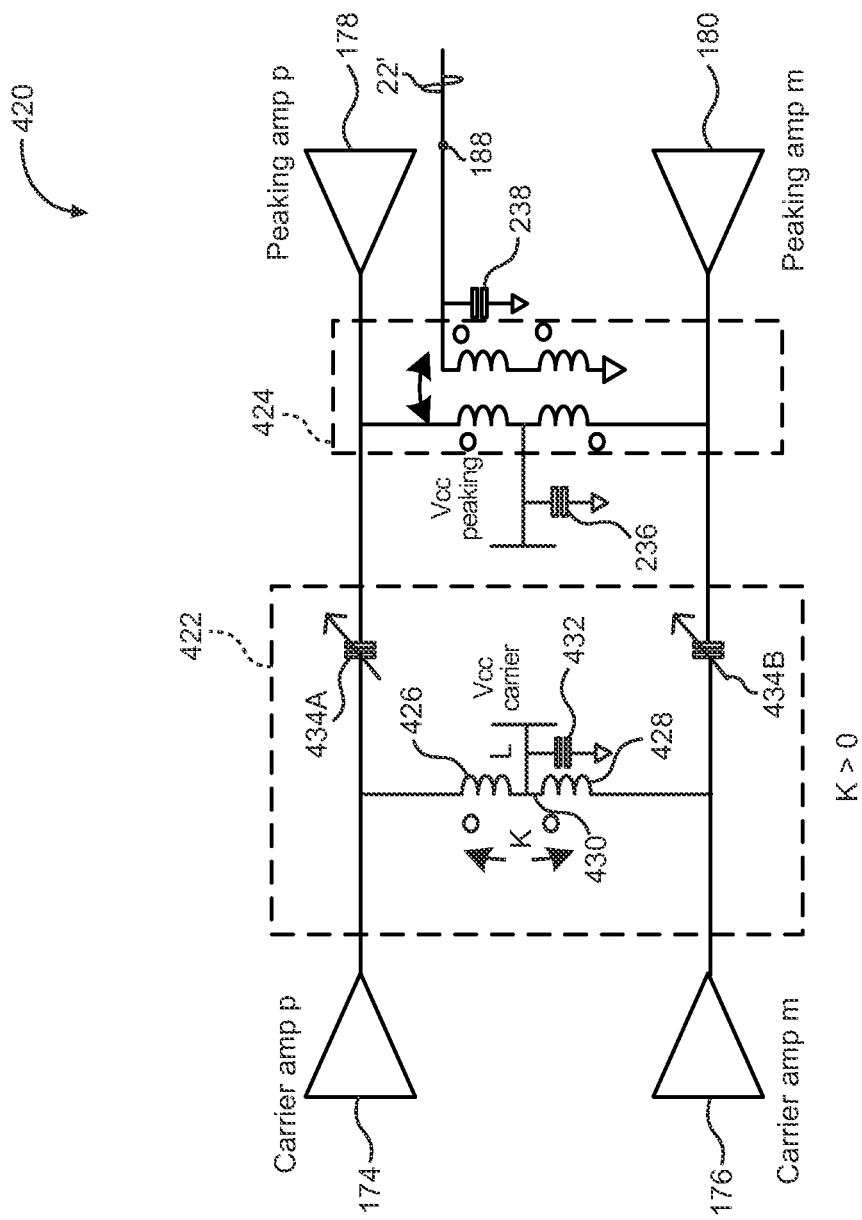

FIG. 9 provides an alternate power amplifier circuit where the impedance inverter is based on the topology derived in FIGS. 6A-6D.

Figure 10:
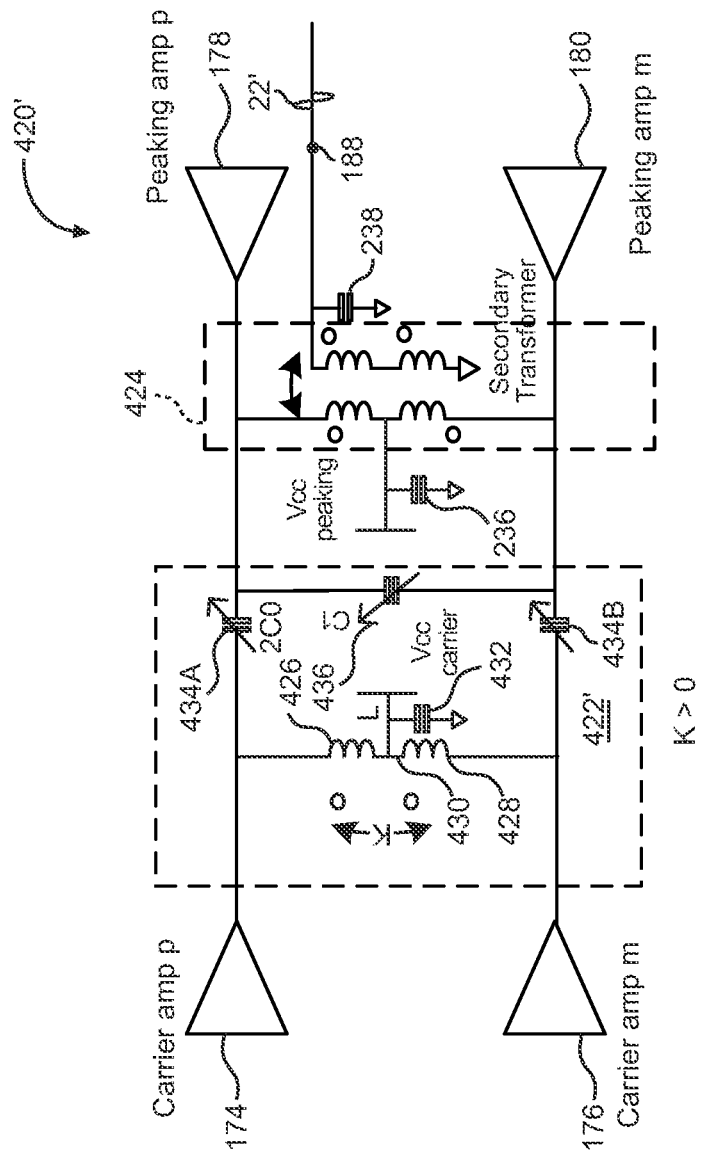
Figure 11:
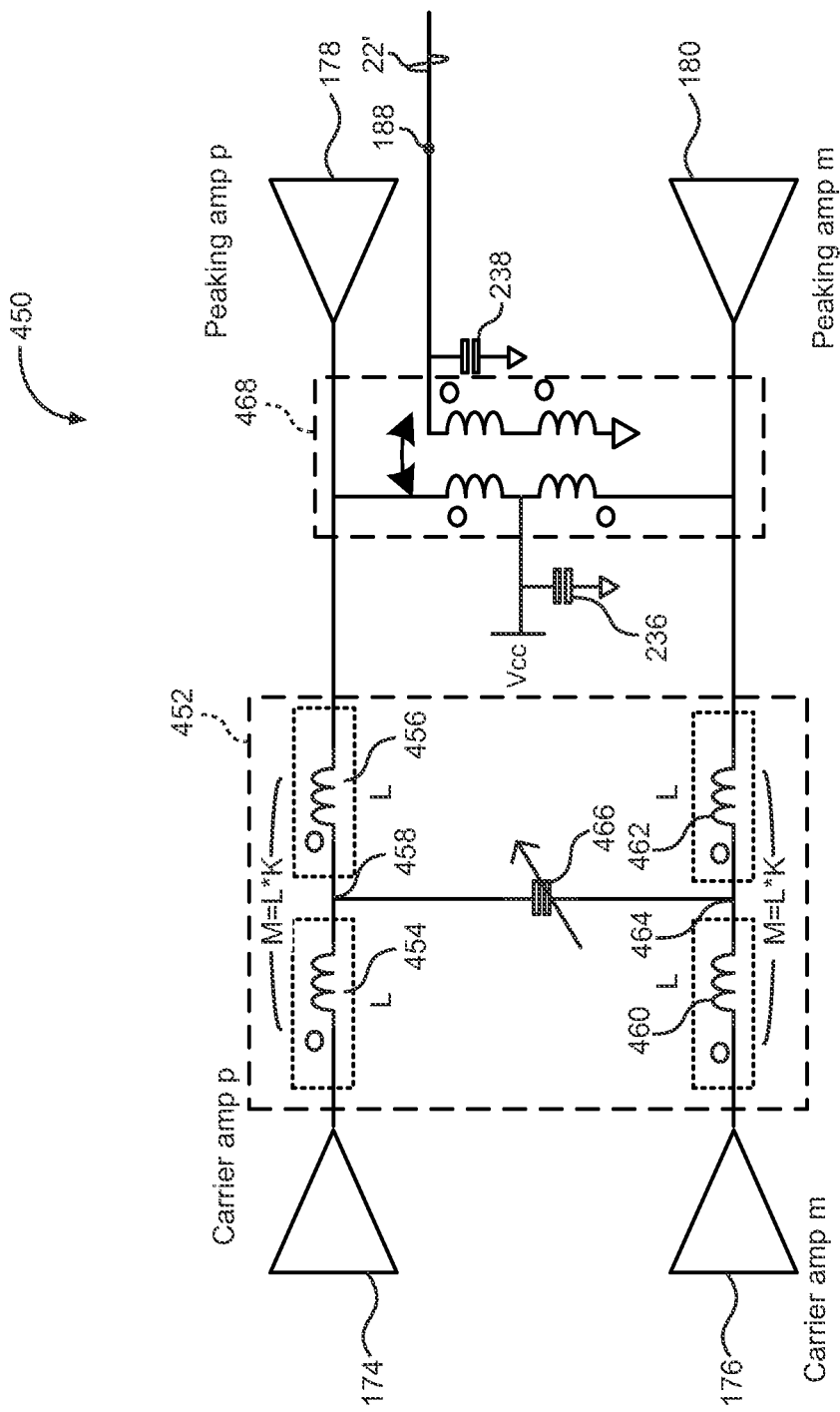
Figure 12:
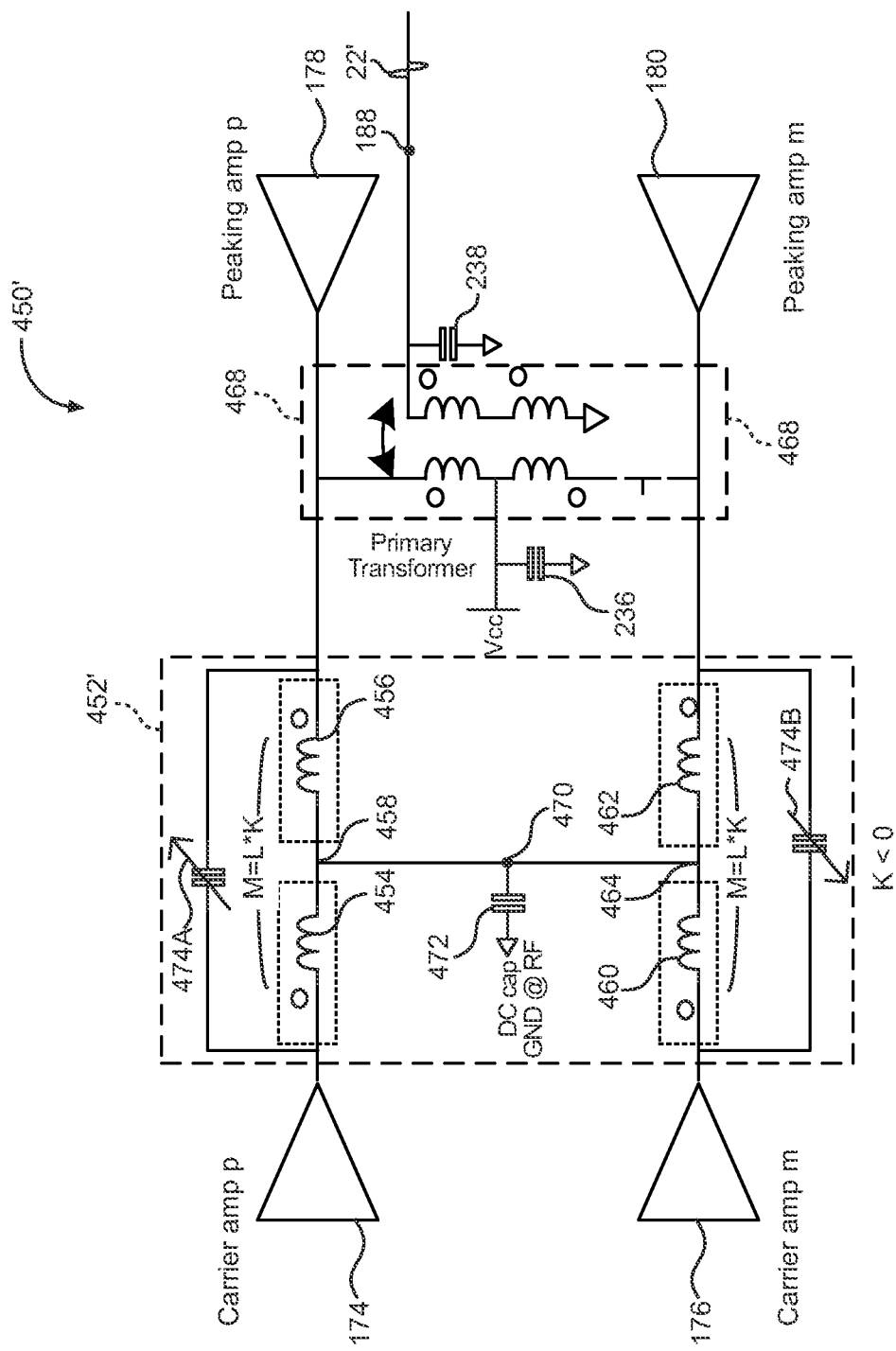

FIG. 10 provides an alternate power amplifier circuit where the impedance inverter includes an additional variable capacitor;

FIG. 11 provides an alternate power amplifier circuit using negatively-coupled inductors in the impedance inverter, FIG. 12 provides an alternate power amplifier circuit using positively-coupled inductors in the impedance inverter with parallel variable capacitors.

Figure 13:
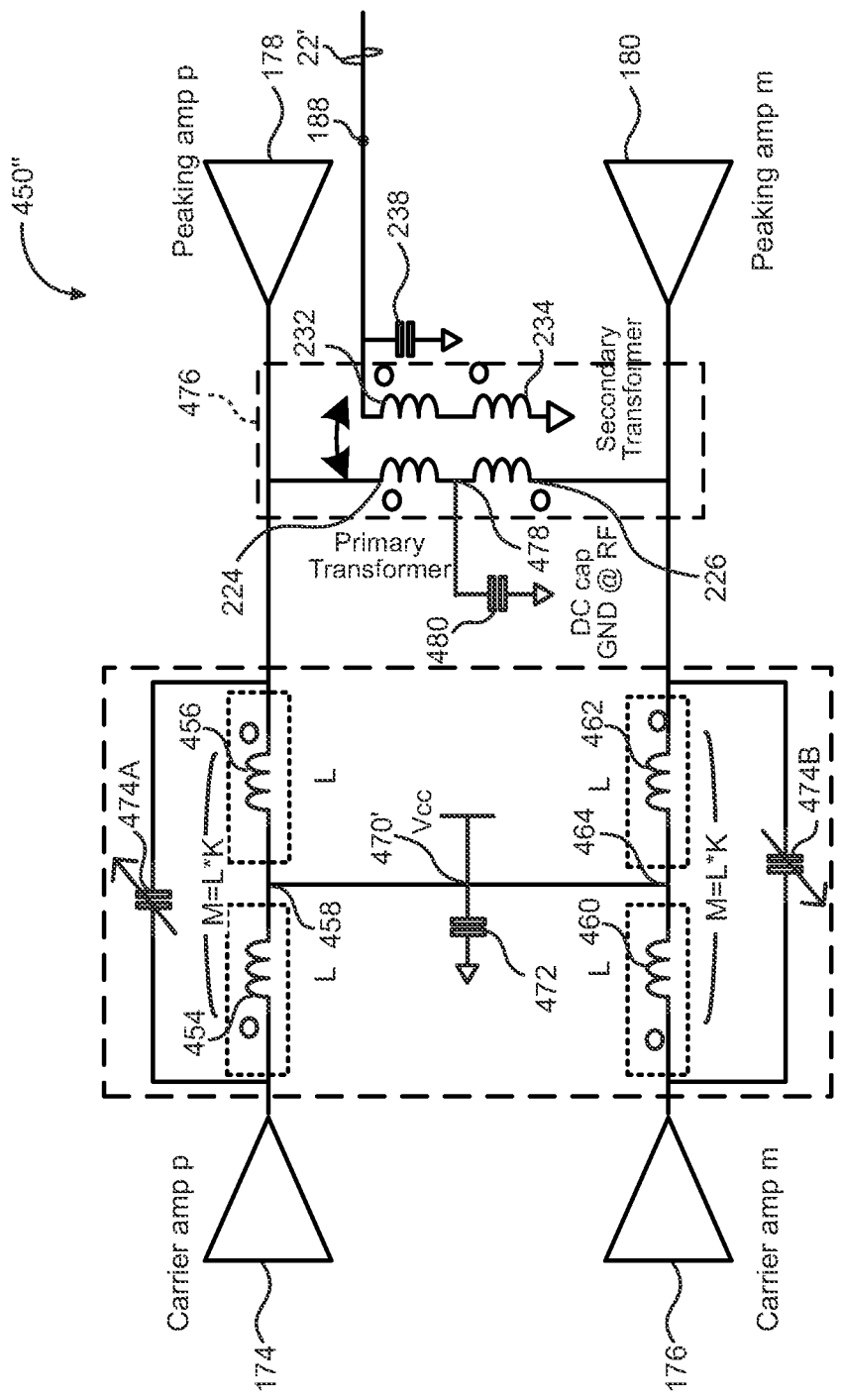

FIG. 13 provides an alternate power amplifier circuit where Vcc_carrier is provided to the transformer circuit instead of the impedance inverter.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a barely Doherty dual envelope tracking ($BD^2E$) circuit. In a non-limiting example, a transmitter chain includes an envelope tracking (ET) circuit that controls a Doherty dual power amplifier array. The ET circuit provides two control signals (supply voltage signals) that are used to control or modulate a carrier amplifier and a peaking amplifier independently of one another. The $BD^2E$ circuit includes an improved impedance inverter that isolates the peaking amplifier from the carrier amplifier to allow this independent control. By providing independent control, greater linearity may be provided while preserving the efficiency of the circuit.

Figure 1:
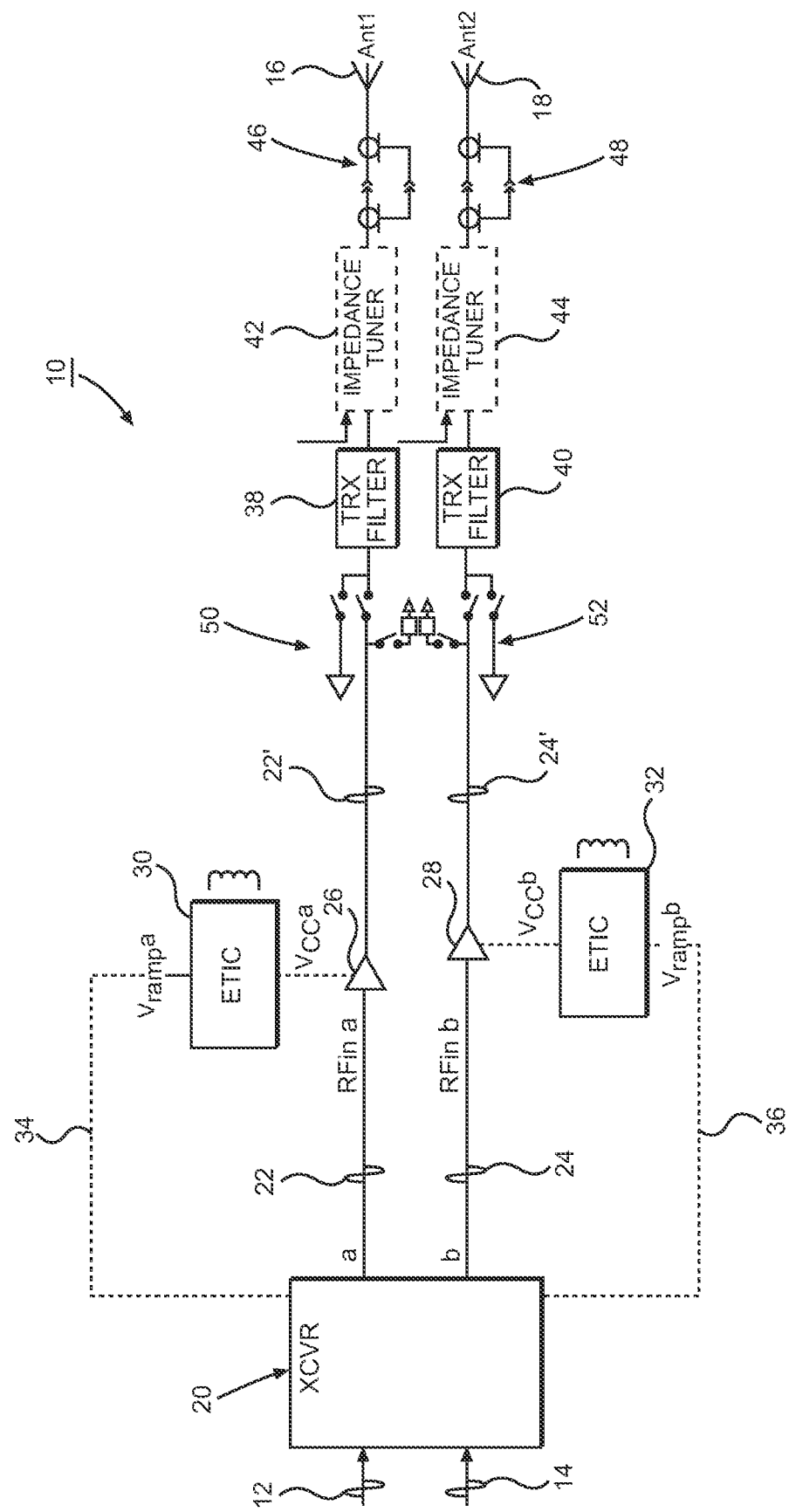
FIG. 1 is a schematic diagram of an exemplary multiple input-multiple output (MIMO) transmitter apparatus that uses an envelope tracking (ET) circuit according to an exemplary aspect of the present disclosure.
Figure 2A:
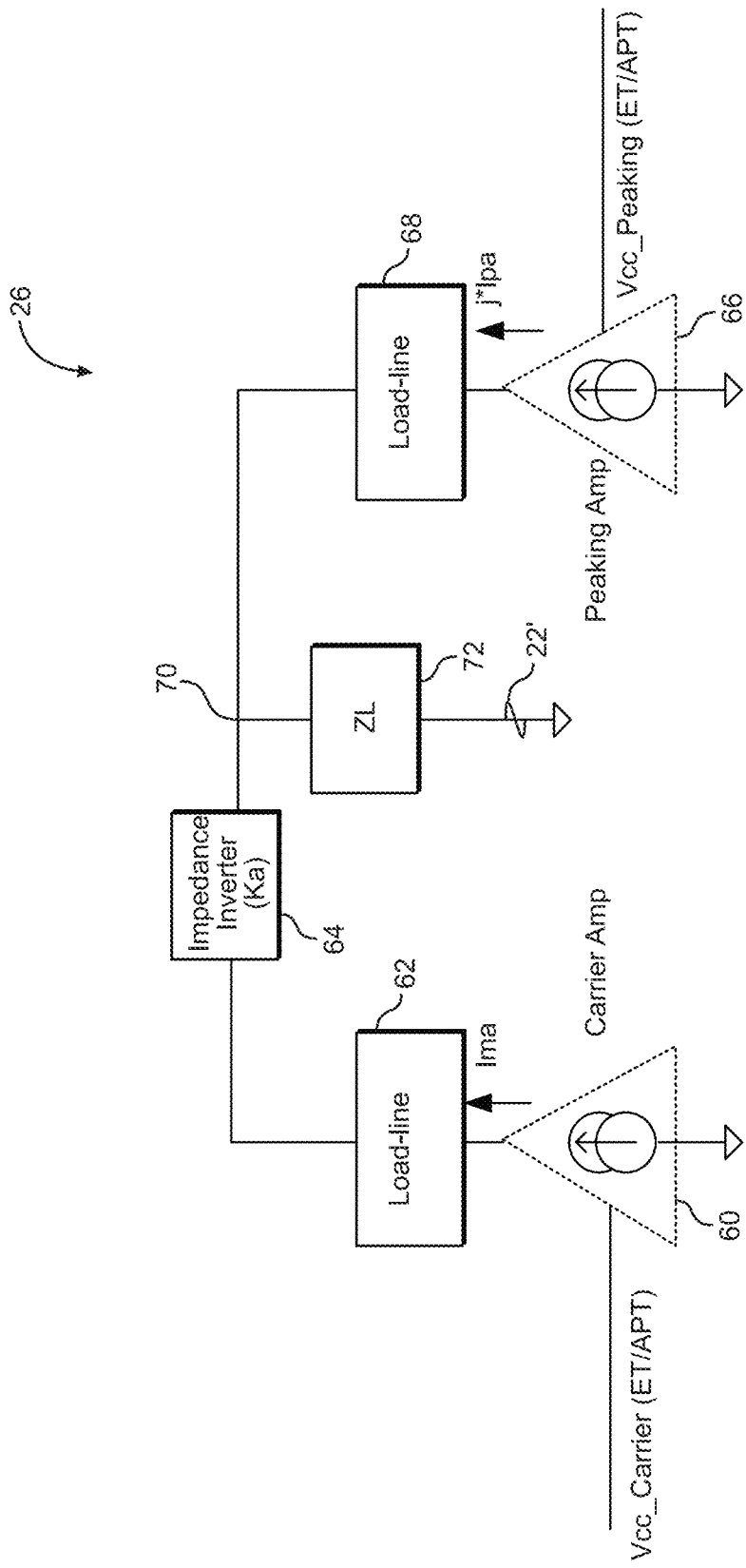
FIG. 2A is a circuit diagram of a conventional Doherty dual amplifier circuit that may be used in a transmitter apparatus.
Figure 2B:
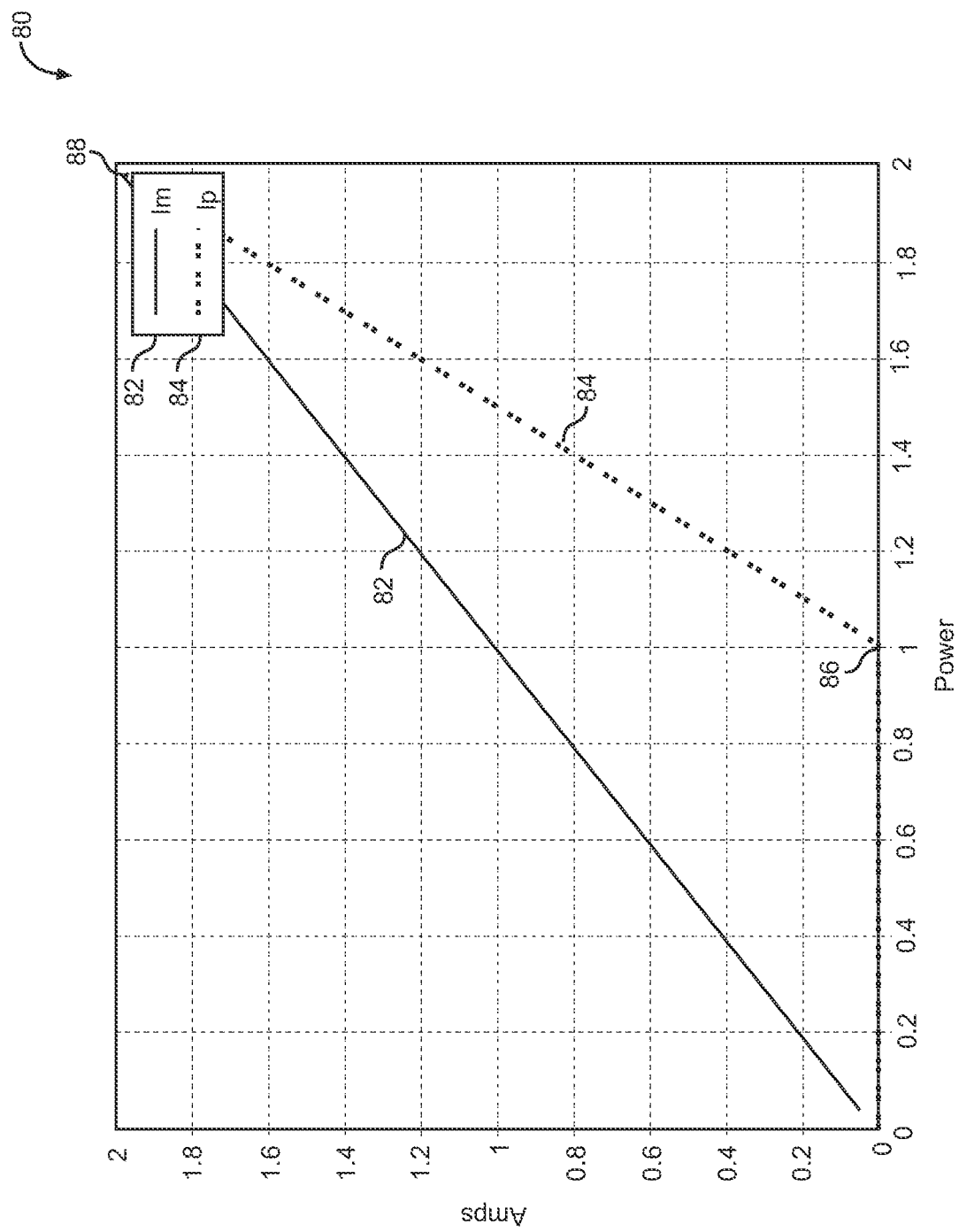
FIG. 2B is a graph showing the current for a carrier amplifier and a peaking amplifier from the Doherty dual amplifier circuit of FIG. 2A.

Before addressing the particular impedance inverter of the present disclosure and its use with a Doherty dual amplifier circuit, an overview of a transmitter apparatus is provided with reference to FIG. 1. A Doherty dual amplifier structure provided in FIG. 2A is explored in a normal mode of operation in FIGS. 2B-2D and in a barely Doherty dual amplifier, operations are explored in FIGS. 3A-3C. A discussion of particular exemplary aspects of the present disclosure begins below with reference to FIG. 4.

In this regard, FIG. 1 is a schematic diagram of an exemplary transmitter apparatus 10 (also referred to as a transmitter circuit) configured to amplify a first input signal 12 and a second input signal 14 for concurrent transmission from a first antenna 16 and a second antenna 18, respectively, as is common in fifth generation-new radio (5G-NR) cellular standards. While exemplary aspects are described with reference to a 5G-NR compliant transmitter, it should be appreciated that the present disclosure is not so limited and may be used in other transmitters, including, but not limited to, single antenna transmitters, uplink multiple antenna transmitters, multiple input-multiple output (MIMO) type transmitters, and the like.

The transmitter apparatus 10 includes a transceiver circuit 20 configured to receive the first input signal 12 and the second input signal 14. The transceiver circuit 20 is configured to generate a first RF signal 22, sometimes referred to as signal a or RFina, from the first input signal 12 and a second RF signal 24, sometimes referred to as signal b or RFinb, from the second input signal 14. Commonly, signals a and b are orthogonal.

The transmitter apparatus 10 includes two (2) power amplifier circuits 26 and 28 to amplify the first RF signal 22 and the second RF signal 24, respectively. The power amplifier circuits 26 and 28 may also be a network of power amplifiers, and each may generically be referred to as a power amplifier network. It should be appreciated that either or both of the power amplifier circuits 26 and 28 may be Doherty dual amplifier circuits. The two power amplifier circuits 26 and 28 may be controlled by ET integrated circuits (ICs) (ETICs) 30 and 32, respectively. The ETICs 30 and 32 are controlled by a Vrampa signal 34 and a Vrampb signal 36 from the transceiver circuit 20. In an exemplary aspect, the signals 34, 36 are differential signals.

After amplification, signals 22' and 24' are provided to respective filters 38 and 40. The filters 38 and 40 are coupled to impedance tuners 42 and 44, respectively. The impedance tuners 42 and 44 are coupled to the antennas 16 and 18, respectively, such as through a coaxial or flex line connection (noted at 46 and 48, respectively). In some instances, there may be no signal being provided to an antenna. In such instances, the line with no signal may be terminated to a known voltage level (e.g., to ground). Accordingly, termination structures 50 and 52 are provided to provide such terminations.

As noted above, the power amplifier circuit 26 and/or the power amplifier circuit 28 may be a Doherty dual amplifier circuit as better illustrated in FIG. 2A. In this example, the power amplifier circuit 26 may be a single-ended amplifier circuit. The power amplifier circuit 26 may include a first amplifier, also known as a carrier amplifier 60, which, since it acts as a modulated current source, provides a current Ima through a load-line 62 to an impedance inverter 64. The carrier amplifier 60 may be controlled by an input voltage Vcc_Carrier, which may be from an envelope tracking (ET) circuit or average power tracking (APT) circuit. Similarly, the power amplifier circuit 26 may include a second amplifier, also known as a peaking amplifier 66, which, since it also acts as a modulated current source, provides a current jlpa through a load-line 68 to a node 70. The node 70 is also coupled to the impedance inverter 64 and to an impedance load 72 (which is the output of the power amplifier circuit 26 (e.g., signal 22' appears at the load 72 to be provided to the filter 38). The peaking amplifier 66 may be controlled by an input voltage Vcc_Peaking, which may also be from an ET circuit or APT circuit. Because of its position, the impedance inverter 64 may be said to couple the carrier amplifier 60 to the peaking amplifier 66.

In a traditional ideal Doherty dual amplifier circuit, only the carrier amplifier 60 is active at power levels from zero to the average power. Once the average power is reached, the peaking amplifier 66 is also activated and operates from the average power to the peak power. In a typical situation, the average power is half the peak power and thus may be considered −6 decibels (dB) below the peak power. This may be visualized by the graph 80 of FIG. 2B, where the line 82 represents the output current Im of the carrier amplifier 60 and the line 84 represents the output current Ip of the peaking amplifier 66. As can be seen in the graph 80, the line 82 linearly increases from zero to the average power 86 (e.g., 1) and continues to the peak power 88 (e.g., 2). In contrast, the line 84 remains at zero until the average power 86 is reached, at which point the line 84 has a linear slope to the peak power 88. At peak power 88, each of the amplifiers 60, 66 is providing half the peak power.

Figure 2C:
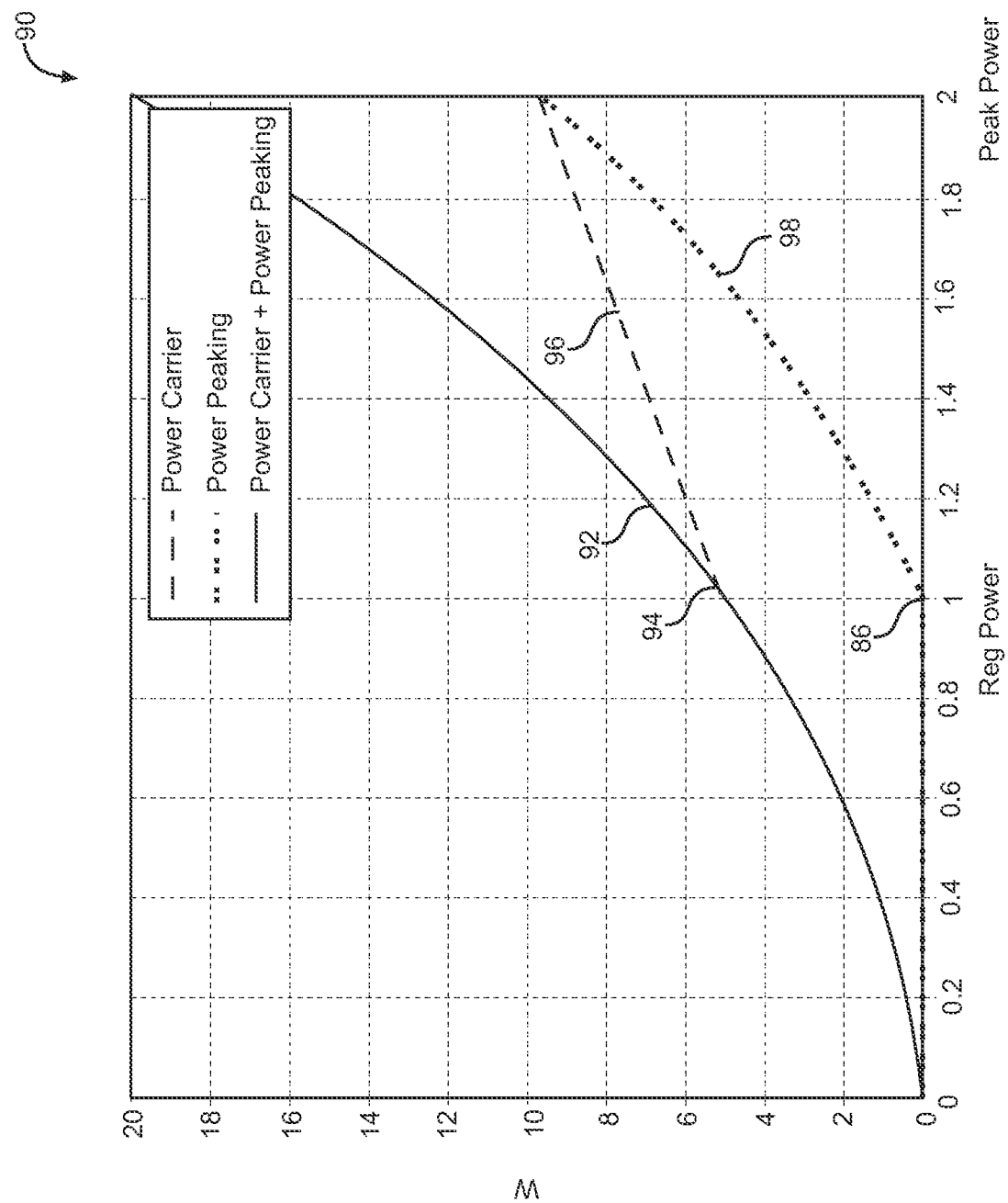
FIG. 2C is a graph showing the power contributions from the carrier amplifier and the peaking amplifier as the power is increased from zero to peak power.

A power graph 90 is provided in FIG. 2C for an alternate representation of this operation. Line 92 is the power provided by the combination of the carrier amplifier 60 and the peaking amplifier 66. Up until point 94, corresponding to the average power 86, all of line 92 is provided by the carrier amplifier 60. At point 94, the carrier amplifier 60 still provides additional power as shown by line 96, but it is only a portion of the total power of line 92. Line 98 shows the power provided by the peaking amplifier 66. Line 98 is zero until the average power 86 is reached at which point the peaking amplifier 66 begins contributing to the total power of line 92.

Figure 2D:
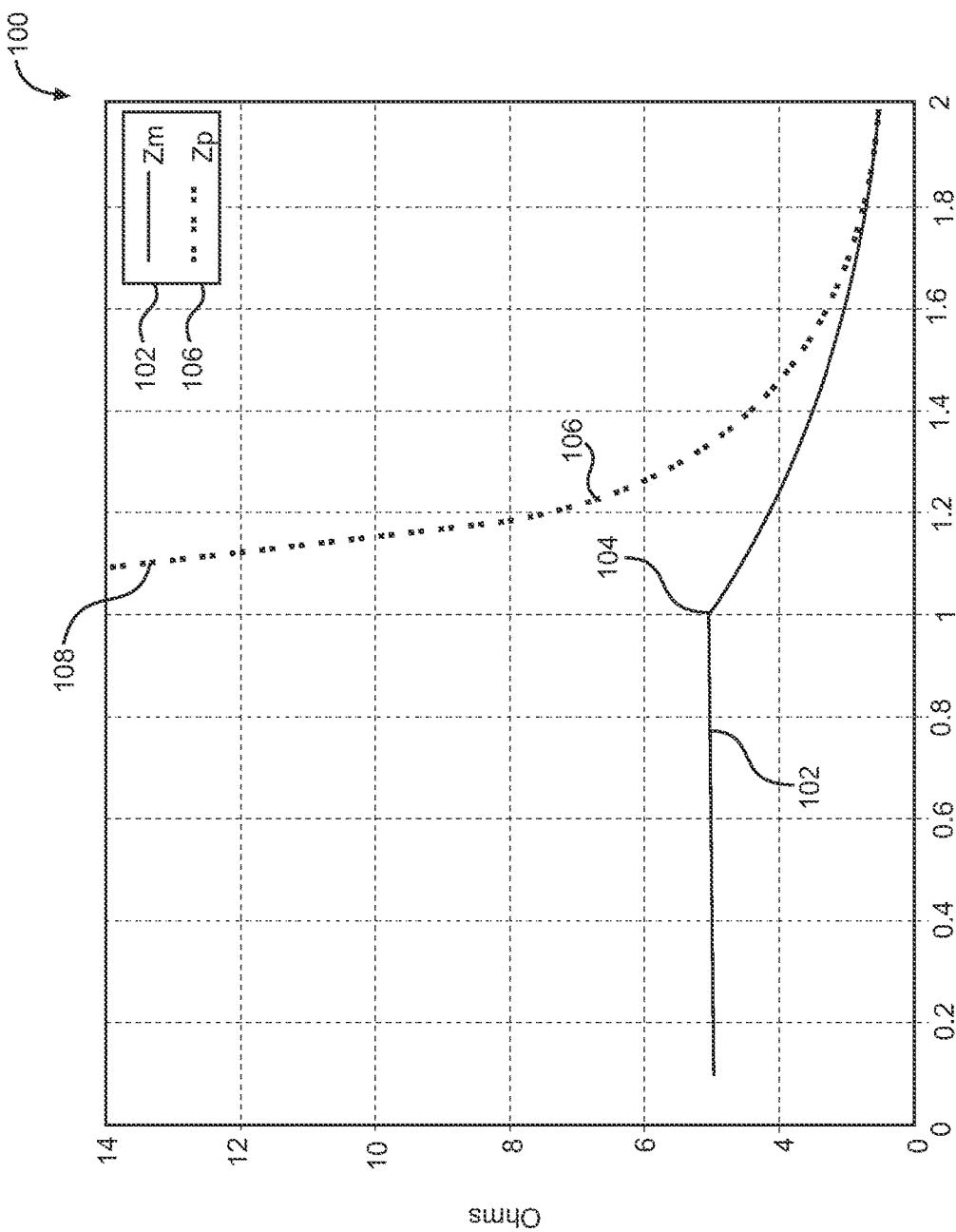
FIG. 2D is a graph showing the load seen by the carrier amplifier and the peaking amplifier as the power is increased from zero to peak power.

The load seen by the power amplifiers 60, 66 is shown in FIG. 2D as graph 100. Specifically, a line 102 shows the load seen by the carrier amplifier 60. Line 102 is flat (and relatively large) until the average power 86 is reached, and at point 104 begins decreasing. Line 106 corresponds to the load seen by the peaking amplifier 66, and line 106 starts at a large impedance point 108 and rapidly diminishes to match the load of the carrier amplifier 60. At peak power, each amplifier 60, 66 is seeing half the load. It should be appreciated that the higher the load seen by the amplifiers 60, 66, the better power transfer.

While a Doherty dual amplifier structure is fine for many situations, a significant non-linearity in performance occurs when the peaking amplifier 66 is activated. Since activation of the peaking amplifier 66 occurs at the average power, this non-linearity negatively impacts performance at a point that occurs frequently in operational conditions. One attempt to improve performance involves moving the activation of the peaking amplifier 66 to a point below the average power. For example, the peaking amplifier 66 may be activated at −12 dB below the peak power. Such early activation is sometimes referred to as barely Doherty dual (BDD or $BD^2$) amplifiers.

Figure 3A:
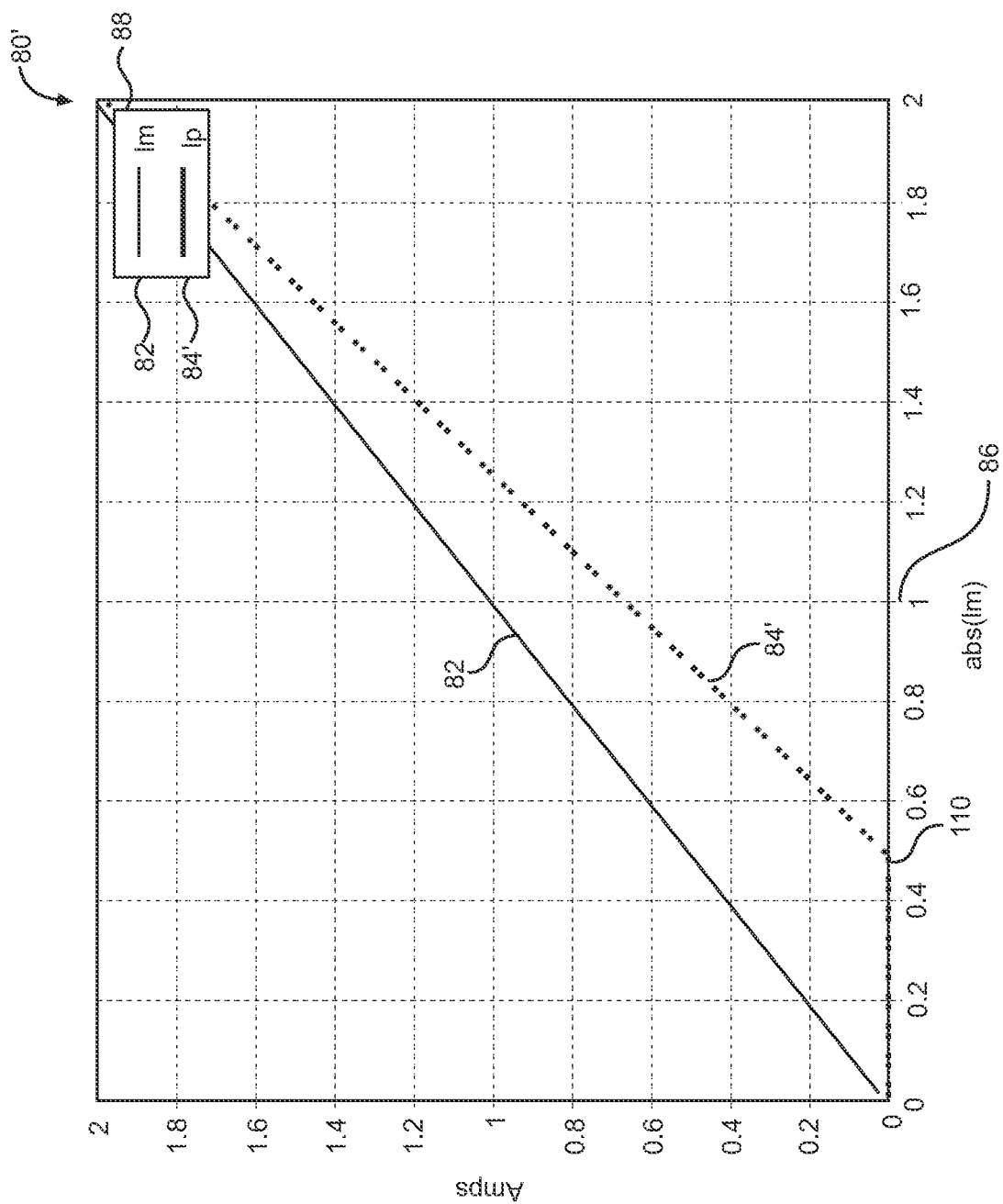
FIG. 3A is a graph showing the current for a carrier amplifier and a peaking amplifier from the Doherty dual amplifier circuit of FIG. 2A when it is operated as a barely Doherty dual amplifier circuit.
Figure 3B:
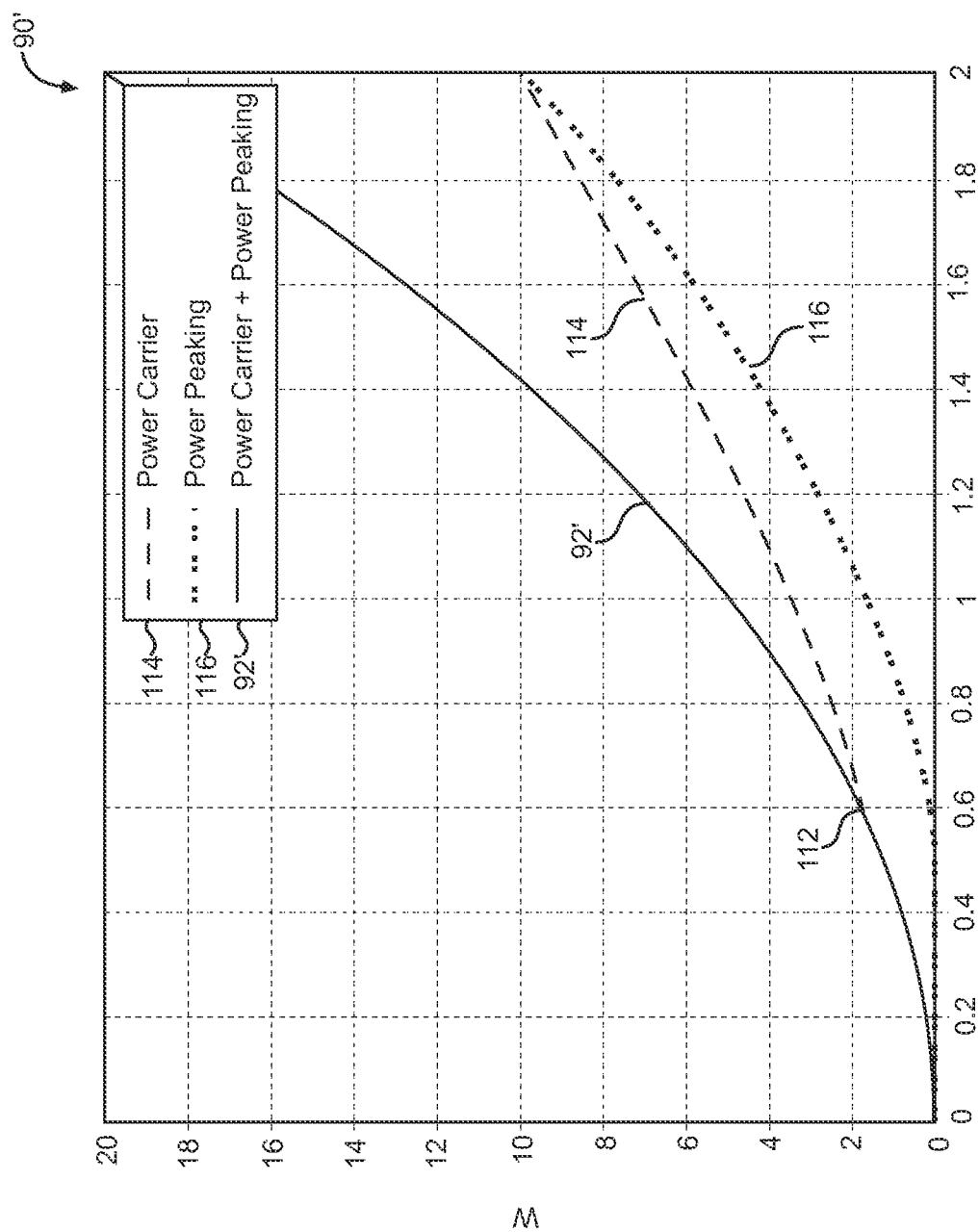
FIG. 3B is a graph showing the power contributions from the carrier amplifier and the peaking amplifier as the power is increased from zero to peak power for the Doherty dual amplifier circuit of FIG. 2A when it is operated as a barely Doherty dual amplifier circuit.
Figure 3C:
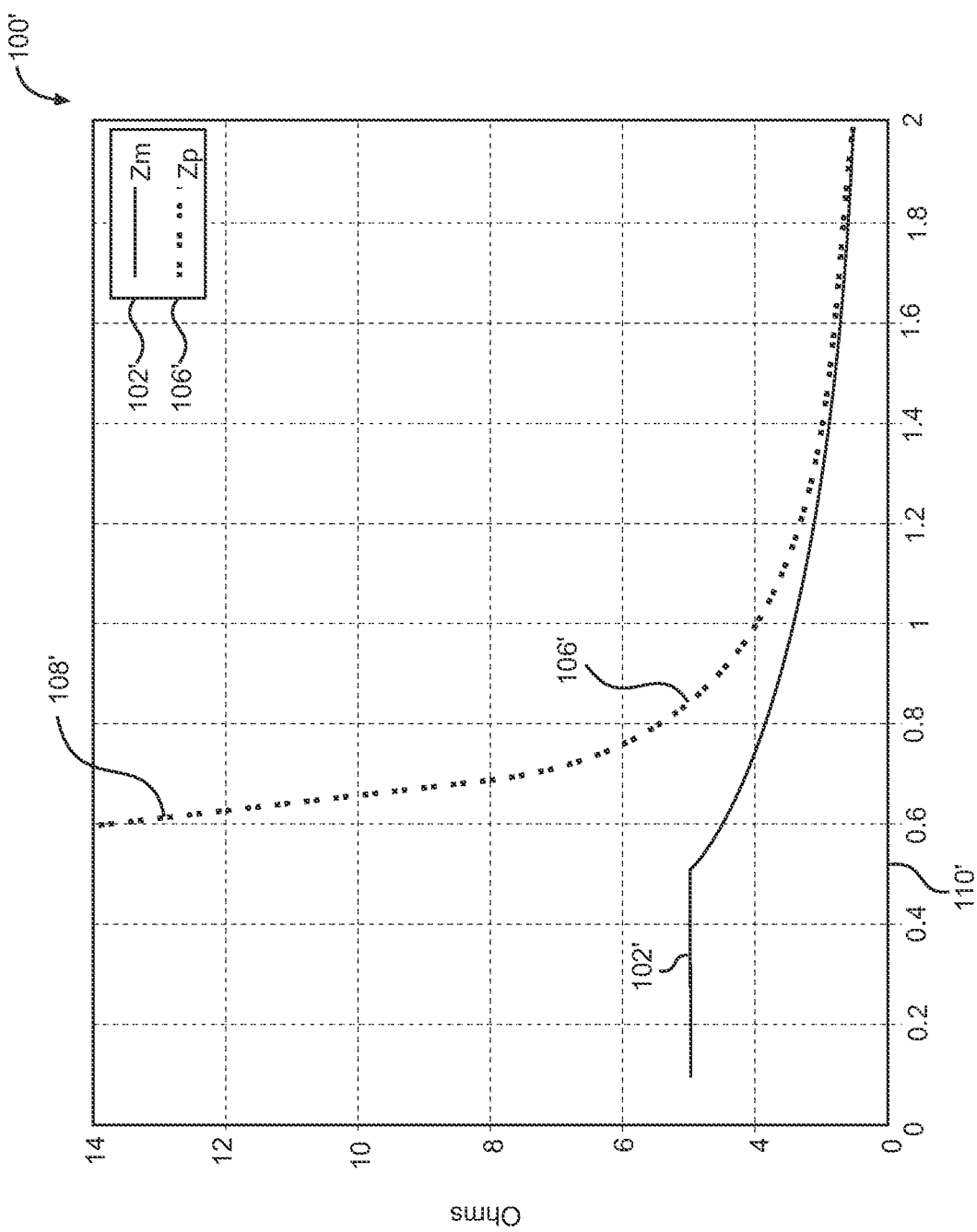
FIG. 3C is a graph showing the load seen by the carrier amplifier and the peaking amplifier as the power is increased from zero to peak power for the Doherty dual amplifier circuit of FIG. 2A when it is operated as a barely Doherty dual amplifier circuit.

BDD or $BD^2$ operation is illustrated in FIGS. 3A-3C, with the understanding that a Doherty dual amplifier circuit can operate in either mode depending on how it is controlled (i.e., the same structure illustrated in FIG. 2A can operate in both normal Doherty dual mode and in barely Doherty dual mode). In particular, FIG. 3A corresponds to FIG. 2B, and shows a graph 80', where the line 82 again represents the output current Im of the carrier amplifier 60 and the line 84' represents the output current Ip of the peaking amplifier 66. As can be seen in the graph 80', the line 82 linearly increases from zero to the average power 86 (e.g., 1) and continues to the peak power 88 (e.g., 2). In contrast, the line 84' remains at zero only until point 110 (e.g., −12 dB) is reached, at which point line 84' has a linear slope to the peak power 88. At peak power 88, each of the amplifiers 60, 66 is providing half the peak power.

A power graph 90' is provided in FIG. 3B for an alternate representation of this operation. Line 92' is the power provided by the combination of the carrier amplifier 60 and the peaking amplifier 66. Up until point 112, corresponding to point 110 in FIG. 3A, all of line 92' is provided by the carrier amplifier 60. At point 112, the carrier amplifier 60 still provides additional power as shown by line 114, but it is only a portion of the total power of line 92'. Line 116 shows the power provided by the peaking amplifier 66. Line 116 is zero until point 112 is reached at which point the peaking amplifier 66 begins contributing to the total power of line 92'.

The load seen by the power amplifiers 60, 66 is shown in FIG. 3C as graph 100'. Specifically, a line 102' shows the load seen by the carrier amplifier 60. Line 102' is flat (and relatively large) until the point 110 is reached. Line 106' corresponds to the load seen by the peaking amplifier 66, and line 106' starts at a large impedance and rapidly diminishes to match the load of the carrier amplifier 60. At peak power, each amplifier 60, 66 is seeing half the load. Thus, the carrier amplifier 60 begins seeing a lower load earlier resulting in an earlier loss of efficiency. Likewise, the peaking amplifier 66 is seeing a lower load earlier (contrast lines 106' with line 106 and point 108 versus point 108').

While $BD^2$ operation moves the non-linearity away from the primary zone of operation, the net impact of moving the activation of the peaking amplifier 66 is a loss of efficiency because of the reduction in load impedance at lower power levels (and across a larger portion of the power range). This loss of efficiency may be addressed in part through the use of ET provided by an ETIC such as the ETIC 30 or 32. ET relies on a signal from an envelope detection circuit in a transceiver circuit to detect changes in the original signal that is going to be amplified. The signal sent from the envelope detection circuit may be single ended or differential. The ETIC then generates a signal that acts as the supply voltage (Vcc) for the power amplifier circuit 26, 28.

In conventional Doherty dual amplifier circuits, the supply voltage signal from the ETIC is provided to both the carrier amplifier and the peaking amplifier. While using an ETIC with a $BD^2$ circuit provides some supply voltage modulation, it fails to take full advantage of the two-amplifier arrangement and still suffers from some loss of efficiency.

Exemplary aspects of the present disclosure allow for independent control of the carrier amplifier and the peaking amplifier. This independent control is achieved by using the impedance inverter to isolate the carrier amplifier from the peaking amplifier. With this isolation, the amplifiers may be controlled independently to maintain linearity and reduce efficiency losses that may result from variations in the load perceived by the two amplifiers. Additionally, digital predistortion (DPD) may be used to help the amplifiers remain in isogain (i.e., having a constant gain).

In this regard, as illustrated in FIG. 4, a transmitter circuit 150 may include a transceiver circuit 152 (sometimes referred to as XCVR and corresponding to the transceiver circuit 20 of FIG. 1), an ETIC 154 (corresponding to the ETIC 30), and a $BD^2E$ power amplifier circuit 156 (corresponding to the power amplifier circuit 26). The power amplifier circuit 156 provides signal 22' to the transmitter filter 38 (not shown) and other downstream circuitry as shown in FIG. 1.

With continuing reference to FIG. 4, the transceiver circuit 152 may include an ET-look up table (ET-LUT) 158, a delay circuit 160, and a digital-to-analog converter (DAC) 162 that collectively generate the Vramp signal that is provided to the ETIC 154. The ETIC 154 receives the Vramp signal at an input 164. This Vramp signal is split into a Vcc_carrier_tgt (target) signal and a signal that is used to determine a desired gain/slope for a peaking amplifier in the power amplifier circuit 156 using a programmable LUT 166. The programmable LUT 166 provides a Vcc_peaking_tgt (target) signal to a tracker circuit 168. The tracker circuit 168 also receives Vcc_carrier_tgt. Based on the two target signals, the tracker circuit 168 generates a Vcc_carrier signal and a Vcc_peaking signal, both of which are supplied through respective outputs 170A, 170B to the power amplifier circuit 156.

With continuing reference to FIG. 4, the power amplifier circuit 156 receives the Vcc_carrier signal and the Vcc_peaking signal at inputs 172A, 172B, respectively. As illustrated, the power amplifier circuit 156 is a differential power amplifier circuit and includes a positive carrier amplifier 174, a negative or minus carrier amplifier 176, a positive peaking amplifier 178, and a negative or minus peaking amplifier 180. The carrier amplifiers 174, 176 are coupled to an impedance inverter 182 as are the peaking amplifiers 178, 180. Direct current (DC) blocking capacitors 184A, 184B may be positioned between the peaking amplifiers 178, 180 and the impedance inverter 182. The Vcc_carrier signal is provided to the impedance inverter 182 and controls the carrier amplifiers 174, 176 as better described below with reference to FIG. 5. The Vcc_peaking signal is supplied at a node within a transformer circuit 186 to control the peaking amplifiers 178, 180 as better described below with reference to FIG. 5. The transformer circuit 186 produces the amplified signal 22' at an output node 188. By allowing the carrier amplifiers 174, 176 to be controlled independently of the peaking amplifiers 178, 180, efficiency of the power amplifier circuit 156 is improved while maintaining more linear characteristics for the operational range. Note that the DC blocking capacitors 184A, 184B effectively block Vcc_peaking from entering the impedance inverter 182 and likewise block Vcc_carrier from reaching the transformer circuit 186.

FIG. 5 provides more detail about an exemplary topology for the impedance inverter 182 and the transformer circuit 186 within the power amplifier circuit 156. Specifically, the impedance inverter 182 includes a first inductor pair 200 and a second inductor pair 202. The first inductor pair 200 includes a first inductor 204 and a second inductor 206 with a node 208 therebetween. The first inductor 204 is positively coupled to the second inductor 206 with a value of M equal to the product of L and K. The second inductor pair 202 includes a third inductor 210 and a fourth inductor 212 with a node 214 therebetween. The third inductor 210 is positively coupled to the fourth inductor 212 with a value of M equal to the product of L and K. The nodes 208 and 214 are coupled and Vcc_carrier is provided at a supply voltage input node 215, where the nodes 208 and 214 are coupled. A capacitor 216 couples the nodes 208, 214 to ground at radio frequencies, allowing Vcc_carrier (which is typically below 100 megahertz (MHz)) to operate normally. A first variable capacitor 218 is positioned in parallel to the first inductor pair 200. Similarly, a second variable capacitor 220 is positioned in parallel to the second inductor pair 202.

With continuing reference to FIG. 5, the transformer circuit 186 includes a primary transformer 222 formed of inductors 224, 226 having a supply voltage input node 228 therebetween. The transformer circuit 186 further includes a secondary transformer 230 formed of inductors 232, 234. Vcc_peaking is provided at the supply voltage input node 228. A capacitor 236 couples the supply voltage input node 228 to ground at radio frequencies, allowing Vcc_peaking (which is typically below 100 MHz) to operate normally. The secondary transformer 230 is coupled to an output load to provide the amplified signal 22'. An additional capacitor 238 is provided to couple the output node 188 to ground at baseband frequencies, allowing the amplified signal 22' to operate at radio frequencies.

Figure 6A:
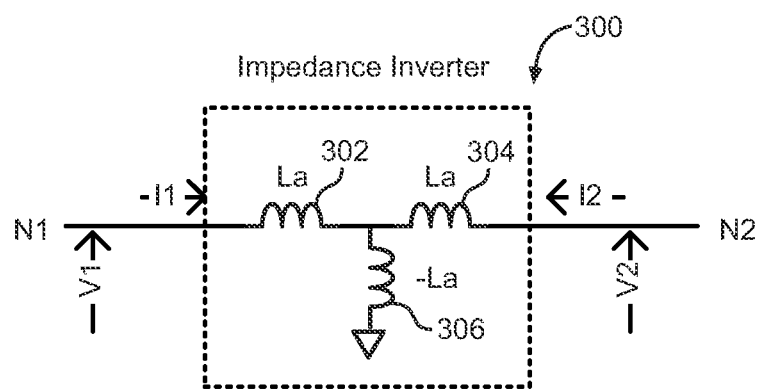

The topology of the impedance inverter is selected to allow the impedance at an input multiplied by an impedance at an output to be a constant. Accordingly, a mathematical interlude is provided to explain how such selection can be made. FIG. 6A shows an ideal impedance inverter 300 based on three element inductors 302, 304, and 306 arranged in a T-network. The middle shunt inductor 306 has a negative inductor of value of −La while the two other inductors 302, 304 have a positive inductor value of La. In the following calculation, one sees that the resulting input impedance on N1, referred to as Z1, can be related to the impedance on N2, referred to as Z2, with Z1*Z2=−Ka² with Ka=−j*La*ω and ω=2*π*f, where f is the frequency. Again, this is an ideal impedance inverter.

Figure 6B:
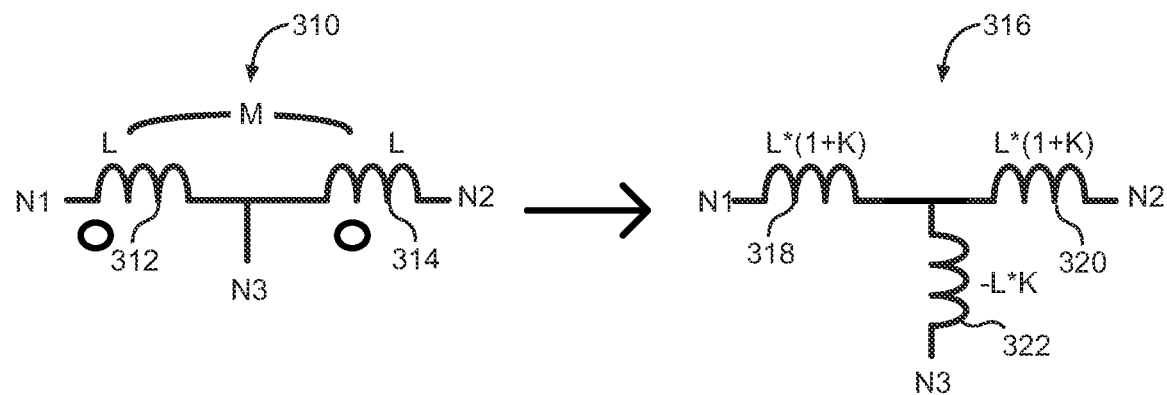

To realize a close implementation to the ideal impedance inverter 300, FIG. 6B shows an approximation of an ideal impedance inverter 310, with two negatively-coupled inductors 312, 314 that have a mutual inductance equal to M=L*K, assuming that the self-inductance of each inductor is L, with K being positive and between 0<K≤1. The impedance inverter 310 approximates the ideal impedance inverter 300 as evidenced by an equivalent lumped impedance inverter circuit 316, having inductors 318, 320, and 322 that can be formed from the topology of the impedance inverter 310. The inductor 322 has a negative inductance value of −L*K, which is not the same inductance value of the inductors 318, 320 (i.e., L*(1+K)), but it is close.

Figure 6C:
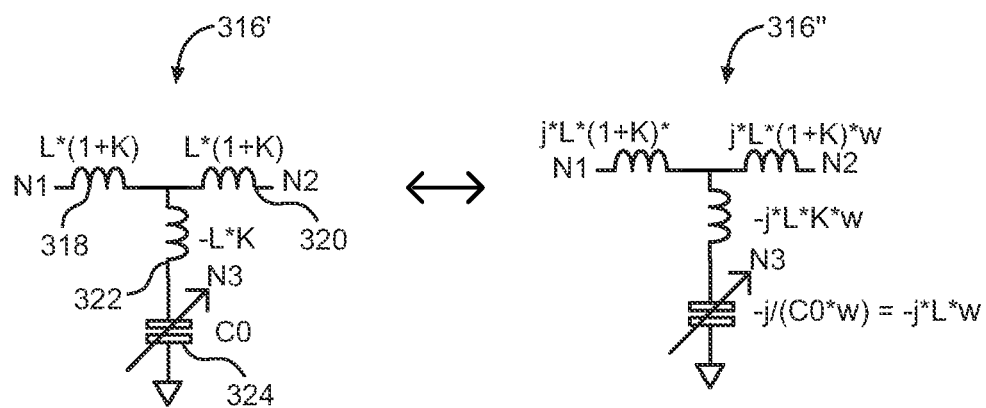

To make the impedance inverter 310 closer to an ideal impedance inverter, a series capacitor may be added as better illustrated in FIG. 6C. Specifically, an impedance inverter 316' has the inductors 318, 320, and 322 with a variable capacitor (C0) 324 added on the node N3 to add the remaining extra negative reactance such that the sum of the negative inductor reactance with the added capacitive reactance is equal in amplitude but opposite in sign to the positive reactance of the two inductors L*(1+K).

This means that if −j/(C0*ω)=−j*L*ω and thus C0*L=1/ω2, then an ideal impedance inverter 316" is obtained at the frequency $$f = \frac{1}{\left(2*\pi*\sqrt{(L*C0)}\right)}$$

with the Ka factor $$Ka = -j*L*(1+K)*\omega = -j*\sqrt{\left(\frac{L*(1+K)}{C0}\right)}.$$

Figure 6D:
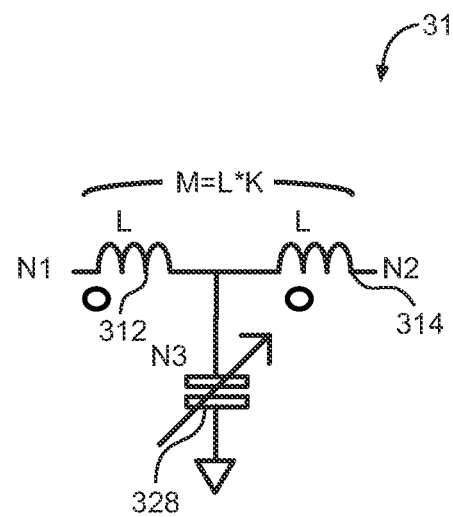

Converting back to the structure of the impedance inverter 310 based on the impedance inverter 316", FIG. 6D shows impedance inverter 310' with negatively-coupled inductors 312, 314 and a variable capacitor 328 that has the desired coefficient Ka at the resonance frequency.

The impedance inverter 310' compared with just using two non-coupled inductors has a higher Ka factor for the same inductance due to the increased term (1+K); that is, one can create a larger Ka factor for a given L value by creating the negative coupling. Also, tuning of the Ka factor can be done via adjusting the value of C0 versus frequency of operation thereby changing the resonance frequency.

Figure 7A:
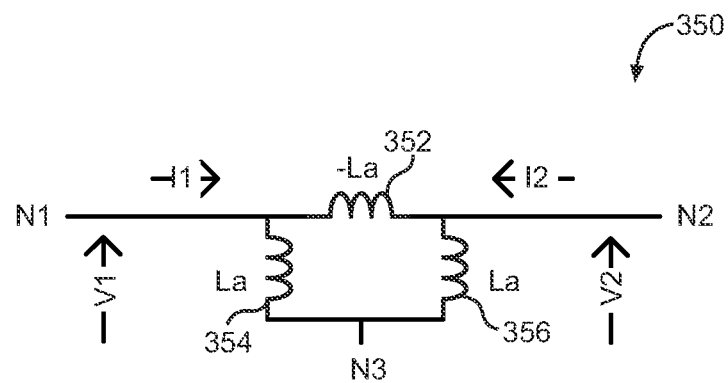

Another approach to finding a topology for the impedance inverter to be used in the power amplifier circuit 26 would start from a π-network 350 illustrated in FIG. 7A. The network 350 is based on three inductors 352, 354, and 356, in which the inductor 352 between N1 and N2 is a negative inductor of value −La, while the two other inductors 354, 356 are La each. Thus, the network 350 has Z1*Z2=−Ka², with Ka=j*La*ω.

Figure 7B:
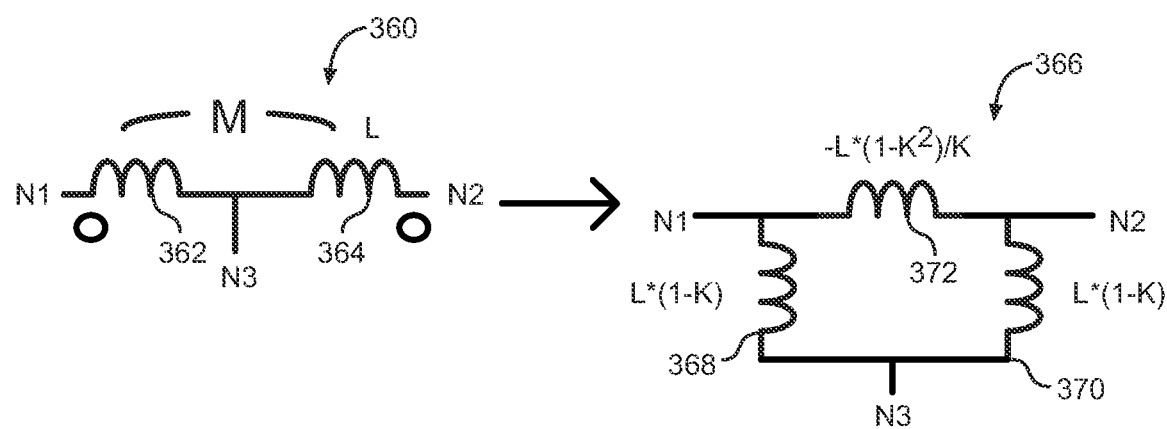

To create a close impedance inverter network like the network 350, an impedance network 360 is formed as illustrated in FIG. 7B. The impedance network 360 has two positively coupled inductors 362, 364 with M=L*K, with K being a negative value with −1≤K<0. The impedance network 360 approximates the network 350 as evidenced by an equivalent lumped impedance network 366, having inductors 368, 370, and 372 that can be formed from the topology of the impedance network 360. The inductor 372 has a negative inductance value of −L*(1−K²)/K, which is not the same inductance value the inductors 368, 370 (i.e., L*(1−K)), but it is close.

Figure 7C:
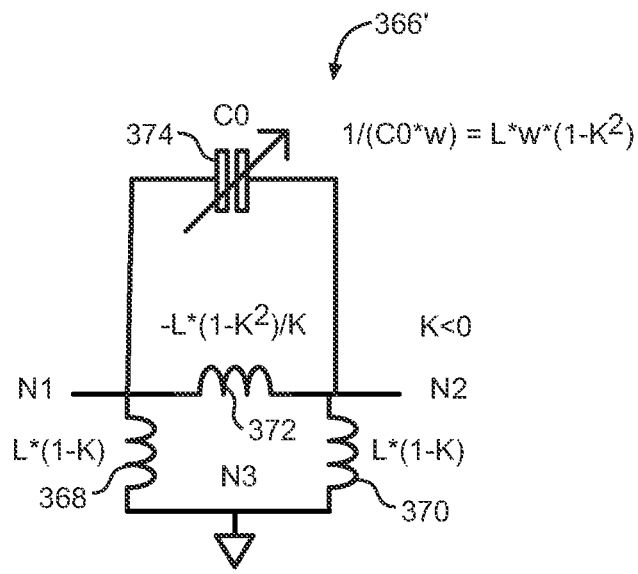

To make the approximation closer, a capacitance may be added. Thus, as illustrated in FIG. 7C, an impedance network 366' has a variable capacitor (C0) 374 that is put in in parallel with the inductor 372 to insert an additional positive admittance such that the equivalent admittance has the same value as the shunt element admittance but with opposite sign.

The value of C0 is selected such that $1/(C0*\omega)=L*(1-K^2)*\omega$, and thus $1/\omega^2=L*(1-K^2)*C0$. The resulting impedance network 366' has a Ka term equal to $j*L*(1-K)*\omega$ with K<0 and thus equal to $$Ka = j * \sqrt{\frac{L}{C0}} * \sqrt{\left(\frac{(1-K)}{(1+K)}\right)},$$

thus allowing creation of a much larger impedance inverter Ka factor due to the term $$\sqrt{\left(\frac{(1-K)}{(1+K)}\right)},$$

which is greater than 1 since K is negative.

Figure 7D:
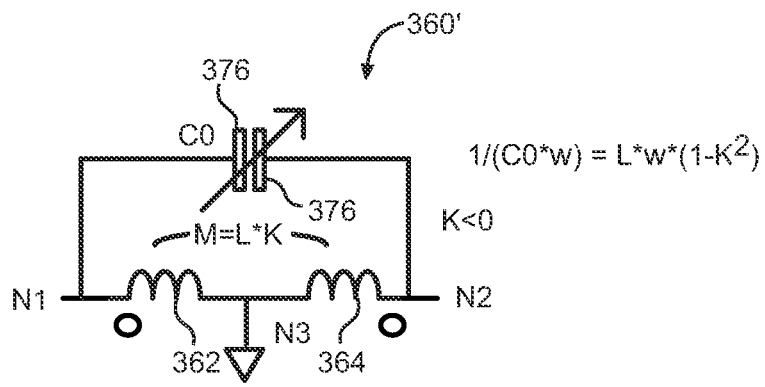

Transforming back to the topology of the impedance network 360, FIG. 7D illustrates an impedance network 360' that has the inductors 362, 364 positively coupled to one another and a variable capacitor 376 in parallel between nodes N1 and N2. It should be appreciated that Ka may be tuned via tuning C0 relative to the frequency of operation. Another important aspect is that the middle node N3, which is tied to an RF ground, can be used as a supply DC bias.

These topologies (i.e., impedance inverter 310' and impedance network 360') as well as other topologies may be used within the impedance inverter 182 to allow the control signals Vcc_carrier and Vcc_peaking to be supplied and control the carrier amplifier and the peaking amplifier to be controlled independently as shown in FIG. 5.

While the structure of FIG. 5 is one way to construct the impedance inverter, there are other options. For example, as illustrated in FIG. 8, the inductors do not have to be physically coupled so long as they are magnetically coupled. Thus, a power amplifier circuit 156' has an impedance inverter 182' and a transformer circuit 186'. The transformer circuit 186' is essentially identical to the transformer circuit 186, but there is no input for the Vcc_peaking between the inductors 224, 226. Likewise, the impedance inverter 182' includes a first inductor 400 and a second inductor 402. The first inductor 400 is positively coupled to the second inductor 402 with a value of M equal to the product of L and K. Note that the first inductor 400 is not electrically coupled to the second inductor 402. The impedance inverter 182' also includes a third inductor 404 and a fourth inductor 406. The third inductor 404 is positively coupled to the fourth inductor 406 with a value of M equal to the product of L and K. Again, the third inductor 404 is not electrically coupled to the fourth inductor 406. Instead of nodes 208 and 214 being coupled, the first and third inductors 400, 404 are coupled with a node 408 therebetween. Likewise, the second and fourth inductors 402, 406 are coupled with a node 410 therebetween. The node 408 receives Vcc_carrier. Because the inductors 400, 404 are isolated from the inductors 402, 406, Vcc_carrier does not reach the inductors 402, 406. The node 408 is also coupled to ground at radio frequencies through a capacitor 412. The node 410 receives Vcc_peak-ing. Again, the isolation between the inductors 400, 404 and the inductors 402, 406 means Vcc_peaking does not reach the inductors 400, 404. The node 410 is also coupled to ground at radio frequencies through a capacitor 414. The first variable capacitor 218 and the second variable capacitor 220 are provided as previously described.

Instead of using the impedance network 360', an impedance inverter can be formed from the impedance inverter 310' as better shown in FIGS. 9 and 10. In particular, FIG. 9 illustrates a power amplifier circuit 420 that includes has an impedance inverter 422 and a transformer circuit 424. The transformer circuit 424 is essentially identical to the transformer circuit 186 and a further discussion is omitted. However, the impedance inverter 422 includes a first inductor 426 and a second inductor 428 with a node 430 therebetween. The first inductor 426 is negatively coupled to the second inductor 428. The node 430 receives Vcc_carrier. A capacitor 432 couples the node 430 to ground at radio frequencies. Additionally, variable capacitors 434A, 434B may be used to isolate the impedance inverter 422 from the transformer circuit 424 at baseband frequencies and allow for some tuning of the resonant frequencies.

FIG. 10 illustrates a similar power amplifier circuit 420' which is essentially identical to the power amplifier circuit 420, but the impedance inverter 422' includes an additional variable capacitor 436 coupling the two variable capacitors 434A, 434B. This additional capacitor allows for extra tuning.

While the most benefit is achieved by providing the ability to control the peaking and carrier amplifiers separately, the present disclosure is not so limited. FIGS. 11-13 provide alternate structures that provide improved impedance inverters, albeit without the independent control.

In this regard, FIG. 11 illustrates a power amplifier circuit 450 with an impedance inverter 452 that has negatively-coupled inductors 454, 456 with node 458 therebetween and negatively-coupled inductors 460, 462 with node 464 therebetween. Nodes 458, 464 are coupled by a variable capacitor 466. The power amplifier circuit 450 also includes a transformer circuit 468 that is identical to the transformer circuits 424 and 186.

FIG. 12 illustrates a similar power amplifier circuit 450' with an impedance inverter 452'. The impedance inverter 452' has positively-coupled inductors 454, 456 with node 458 therebetween and positively-coupled inductors 460, 462 with node 464 therebetween. Nodes 458, 464 are coupled at node 470, which is coupled to ground by a capacitor 472, which couples to ground at radio frequencies, but not baseband frequencies. Additionally, variable capacitors 474A, 474B are provided similar to the variable capacitors 218, 220 of FIG. 5. Again, this arrangement does not allow for independent control of the carrier amplifiers 174, 176 and the peaking amplifiers 178, 180, but does provide a larger impedance inverter.

FIG. 13 illustrates a power amplifier circuit 450" that is similar to the power amplifier circuits 450 and 450' in FIGS. 11 and 12, but moves the input for Vcc_carrier from the transformer circuit to the impedance inverter. Specifically, the node 470' now receives Vcc_carrier. The transformer circuit 476 has a node 478 that is coupled to ground at radio frequencies through a capacitor 480.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier circuit comprising:
a carrier amplifier;
a peaking amplifier;
an impedance inverter coupling the carrier amplifier to the peaking amplifier, the impedance inverter comprising a supply voltage input node, wherein a supply voltage received at the supply voltage input node modulates the carrier amplifier;
a transformer circuit coupled to the peaking amplifier, the transformer circuit comprising a second supply voltage input node, wherein a second supply voltage received at the second supply voltage input node modulates the peaking amplifier separately from modulation of the carrier amplifier; and
an output node coupled to the transformer circuit, wherein an amplified signal from the transformer circuit may be output at the output node.

2. The power amplifier circuit of claim 1, wherein:
the supply voltage comprises a Vcc_carrier signal from an envelope tracking integrated circuit (ETIC);
the second supply voltage comprises a Vcc_peaking signal from the ETIC; and
the power amplifier circuit is configured to operate as a Doherty dual amplifier circuit.

3. The power amplifier circuit of claim 1, wherein the impedance inverter comprises:
a first inductor pair comprising a first inductor and a second inductor having a first node therebetween, wherein the first inductor and the second inductor are positively coupled; and
a second inductor pair comprising a third inductor and a fourth inductor with a second node therebetween, wherein the third inductor and the fourth inductor are positively coupled;
wherein the first node and the second node are coupled to the supply voltage input node.

4. The power amplifier circuit of claim 3, further comprising a shunt capacitor coupling the supply voltage input node to ground at radio frequencies, but not at baseband frequencies.

5. The power amplifier circuit of claim 3, wherein the impedance inverter further comprises a variable capacitor electrically parallel to the first inductor pair.

6. The power amplifier circuit of claim 1, further comprising a direct current (DC) blocking capacitor positioned between the impedance inverter and the transformer circuit.

7. The power amplifier circuit of claim 1, wherein the power amplifier circuit comprises a differential power amplifier circuit and the carrier amplifier comprises a positive carrier amplifier and a negative carrier amplifier.

8. The power amplifier circuit of claim 1, wherein the transformer circuit comprises a primary transformer comprising a first inductor and a second inductor with the second supply voltage input node therebetween.

9. The power amplifier circuit of claim 8, wherein the transformer circuit further comprises a secondary transformer coupled to the output node.

10. The power amplifier circuit of claim 1, wherein the impedance inverter comprises a first inductor coupled to a second inductor with the supply voltage input node therebetween, the first inductor negatively coupled to the second inductor.

11. A transmitter circuit comprising:
a transceiver;
an envelope tracking (ET) circuit coupled to the transceiver, wherein the ET circuit is configured to provide a first voltage supply signal and a second voltage supply signal; and
a power amplifier circuit comprising:
a carrier amplifier;
a peaking amplifier;
an impedance inverter coupling the carrier amplifier to the peaking amplifier, the impedance inverter comprising a supply voltage input node coupled to the ET circuit to receive the first voltage supply signal; and
a transformer circuit coupled to the peaking amplifier, the transformer circuit comprising a second supply voltage input node coupled to the ET circuit to receive the second voltage supply signal;
wherein the peaking amplifier is modulated separately from the carrier amplifier; and
an output node coupled to the transformer circuit, wherein an amplified signal from the transformer circuit may be output at the output node.

12. The transmitter circuit of claim 11, wherein the impedance inverter comprises:
a first inductor pair comprising a first inductor and a second inductor having a first node therebetween, wherein the first inductor and the second inductor are positively coupled; and
a second inductor pair comprising a third inductor and a fourth inductor with a second node therebetween, wherein the third inductor and the fourth inductor are positively coupled;
wherein the first node and the second node are coupled to the supply voltage input node.

13. The transmitter circuit of claim 12, wherein the impedance inverter further comprises a variable capacitor electrically parallel to the first inductor pair.

14. The transmitter circuit of claim 11, wherein the power amplifier circuit further comprises a direct current (DC) blocking capacitor positioned between the impedance inverter and the transformer circuit.

15. The transmitter circuit of claim 11, wherein the power amplifier circuit comprises a differential power amplifier circuit and the carrier amplifier comprises a positive carrier amplifier and a negative carrier amplifier.

16. The transmitter circuit of claim 11, wherein the transformer circuit comprises a primary transformer comprising a first inductor and a second inductor with the second supply voltage input node therebetween.

17. The transmitter circuit of claim 16, wherein the transformer circuit further comprises a secondary transformer coupled to the output node.

18. A power amplifier circuit comprising:
a carrier amplifier;
a peaking amplifier;
an impedance inverter coupling the carrier amplifier to the peaking amplifier, the impedance inverter comprising:
a first supply voltage input node, wherein a first supply voltage received at the first supply voltage input node modulates the carrier amplifier; and
a second supply voltage input node, wherein a second supply voltage received at the second supply voltage input node modulates the peaking amplifier;
a transformer circuit coupled to the peaking amplifier; and
an output node coupled to the transformer circuit, wherein an amplified signal from the transformer circuit may be output at the output node.

19. The power amplifier circuit of claim 18, wherein the impedance inverter comprises:
  a first inductor;
  a second inductor electrically isolated from the first inductor, the second inductor positively coupled to the first inductor;
  a third inductor electrically coupled to the first inductor, the first supply voltage input node between the first inductor and the third inductor; and
  a fourth inductor electrically isolated from the third inductor, the fourth inductor positively coupled to the third inductor, the fourth inductor electrically coupled to the second inductor, the second supply voltage input node between the second inductor and the fourth inductor.

20. The power amplifier circuit of claim 19, further comprising a variable capacitor coupling the first inductor and the second inductor.

21. A power amplifier circuit comprising:
  a carrier amplifier;
  a peaking amplifier;
  an impedance inverter coupling the carrier amplifier to the peaking amplifier, the impedance inverter comprising an inductor pair comprising a first inductor positively coupled to a second inductor, the second inductor in series with the first inductor;
  a transformer circuit coupled to the peaking amplifier, the transformer circuit comprising a supply voltage input node, wherein a supply voltage received at the supply voltage input node modulates the peaking amplifier and the carrier amplifier; and
  an output node coupled to the transformer circuit, wherein an amplified signal from the transformer circuit may be output at the output node.

* * * * *